(12) United States Patent
Wong et al.

(10) Patent No.: US 11,949,002 B2
(45) Date of Patent: Apr. 2, 2024

(54) SEMICONDUCTOR DEVICE AND METHOD

(71) Applicant: Taiwan Semiconductor Manufacturing Company, Ltd., Hsinchu (TW)

(72) Inventors: I-Hsieh Wong, Hsinchu (TW); Yen-Ting Chen, Taichung (TW); Wei-Yang Lee, Taipei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 109 days.

(21) Appl. No.: 17/838,649

(22) Filed: Jun. 13, 2022

(65) Prior Publication Data

US 2022/0328661 A1 Oct. 13, 2022

Related U.S. Application Data

(63) Continuation of application No. 16/382,860, filed on Apr. 12, 2019, now Pat. No. 11,362,199.
(Continued)

(51) Int. Cl.
*H01L 29/66* (2006.01)
*H01L 21/02* (2006.01)
*H01L 21/306* (2006.01)
*H01L 21/3065* (2006.01)
*H01L 21/311* (2006.01)
*H01L 29/08* (2006.01)
*H01L 29/78* (2006.01)

(52) U.S. Cl.
CPC .... *H01L 29/66818* (2013.01); *H01L 29/0847* (2013.01); *H01L 29/66545* (2013.01); *H01L 29/785* (2013.01); *H01L 21/02233* (2013.01); *H01L 21/02255* (2013.01); *H01L 21/30604* (2013.01); *H01L 21/3065* (2013.01); *H01L 21/31111* (2013.01)

(58) Field of Classification Search
CPC ...... H01L 29/66; H01L 29/785; H01L 21/022
See application file for complete search history.

(56) References Cited

U.S. PATENT DOCUMENTS

| | | | |
|---|---|---|---|
| 7,172,943 B2 | 2/2007 | Yeo et al. | |
| 8,487,378 B2 | 7/2013 | Goto et al. | |
| | (Continued) | | |

FOREIGN PATENT DOCUMENTS

| | | |
|---|---|---|
| CN | 1630094 A | 6/2005 |
| CN | 108807536 A | 11/2018 |
| | (Continued) | |

*Primary Examiner* — Marvin Payen
(74) *Attorney, Agent, or Firm* — Slater Matsil, LLP

(57) ABSTRACT

In an embodiment, a method includes: forming a fin extending from a substrate, the fin having a first width and a first height after the forming; forming a dummy gate stack over a channel region of the fin; growing an epitaxial source/drain in the fin adjacent the channel region; and after growing the epitaxial source/drain, replacing the dummy gate stack with a metal gate stack, the channel region of the fin having the first width and the first height before the replacing, the channel region of the fin having a second width and a second height after the replacing, the second width being less than the first width, the second height being less than the first height.

20 Claims, 29 Drawing Sheets

Related U.S. Application Data

(60) Provisional application No. 62/773,320, filed on Nov. 30, 2018.

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 8,941,214 B2 | 1/2015 | Sell |
| 8,987,791 B2 | 3/2015 | Huang et al. |
| 9,397,217 B2 | 7/2016 | Tseng et al. |
| 9,614,056 B2 | 4/2017 | Xie et al. |
| 9,653,605 B2 | 5/2017 | Zhang et al. |
| 9,941,406 B2 | 4/2018 | Ching et al. |
| 2012/0012932 A1 | 1/2012 | Perng et al. |
| 2014/0141589 A1 | 5/2014 | Shin et al. |
| 2014/0151761 A1 | 6/2014 | Hsieh et al. |
| 2014/0203334 A1 | 7/2014 | Colinge et al. |
| 2014/0282326 A1 | 9/2014 | Chen et al. |
| 2017/0005011 A1 | 1/2017 | Ching et al. |
| 2017/0005090 A1 | 1/2017 | Ando et al. |
| 2017/0133377 A1 | 5/2017 | Glass et al. |
| 2017/0250268 A1 | 8/2017 | Hsiao et al. |
| 2018/0174913 A1 | 6/2018 | More et al. |
| 2018/0315837 A1 | 11/2018 | Fung et al. |

FOREIGN PATENT DOCUMENTS

| | | |
|---|---|---|
| KR | 20160134655 A | 11/2016 |
| KR | 20160147626 A | 12/2016 |
| KR | 20180069703 A | 6/2018 |
| KR | 20180121303 A | 11/2018 |
| TW | I602301 B | 10/2017 |
| TW | I604607 B | 11/2017 |
| TW | I608547 B | 12/2017 |
| TW | I625858 B | 6/2018 |
| TW | 201826543 A | 7/2018 |

SEMICONDUCTOR DEVICE AND METHOD

PRIORITY CLAIM AND CROSS-REFERENCE

This application is a continuation of U.S. patent application Ser. No. 16/382,860, filed on Apr. 12, 2019, entitled "Semiconductor Device and Method," which application claims the benefit of U.S. Provisional Application No. 62/773,320, filed on Nov. 30, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
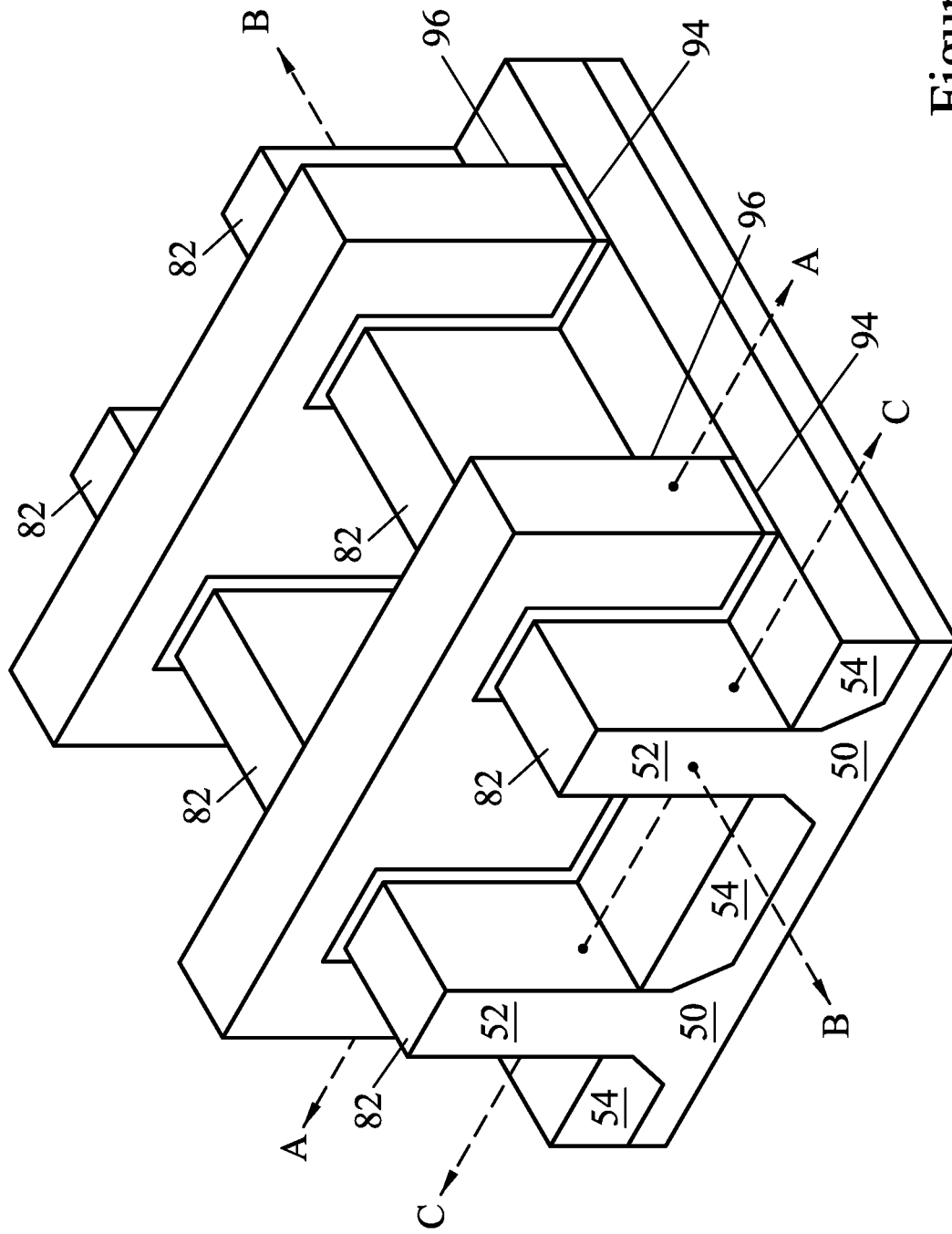
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, Fin Field-Effect Transistors (FinFETs) are formed from fins (e.g., semiconductor strips) in a gate-last process. The fins are trimmed in a fin trim process, which may enhance the gate control of the resulting FinFETs and reduce the short channel effect (SCE) in the resulting FinFETs. However, the fin trim process is delayed until after source/drain regions are formed. In particular, the fin trim process is performed after dummy gate stacks are removed and before replacement gate stacks are formed. Delaying the fin trim process allows a greater fin surface area to be available during an epitaxial growth process for forming the source/drain regions. Further, performing the fin trim process after formation of the source/drain regions allows a vertical distance between the channel regions of the FinFETs and the source/drain regions of the FinFETs to be reduced, which may reduce current crowding effects in the FinFETs. Performance of the resulting FinFETs in some applications (e.g., direct current applications, ring oscillator applications, etc.) may thus be improved.

FIG. 1 illustrates an example of simplified FinFETs in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Isolation regions 54 are disposed over the substrate 50, and the fins 52 protrude above and from between neighboring isolation regions 54. Although the isolation regions 54 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring isolation regions 54.

Gate dielectrics 94 are along sidewalls and over top surfaces of the fins 52, and gate electrodes 96 are over the gate dielectrics 94. Source/drain regions 82 are disposed in opposite sides of the fins 52 with respect to the gate dielectrics 94 and gate electrodes 96. In embodiments where multiple transistors are formed, the source/drain regions 82 may be shared between various transistors. In embodiments where one transistor is formed from multiple fins 52, neighboring source/drain regions 82 may be electrically connected, such as through coalescing the source/drain regions 82 by epitaxial growth, or through coupling the source/drain regions 82 with a same source/drain contact.

FIG. 1 further illustrates several reference cross-sections. Cross-section A-A is along a longitudinal axis of a gate electrode 96 and in a direction, for example, perpendicular to the direction of current flow between the source/drain regions 82. Cross-section B-B is perpendicular to cross-section A-A and is along a longitudinal axis of a fin 52 and in a direction of, for example, a current flow between the source/drain regions 82. Cross-section C-C is parallel to cross-section A-A and extends through the source/drain regions 82. Subsequent figures refer to these reference cross-sections for clarity.

FIGS. 2, 3, 4, and 5 are three-dimensional views of intermediate stages in the manufacturing of FinFETs, in accordance with some embodiments.

Figure 2:
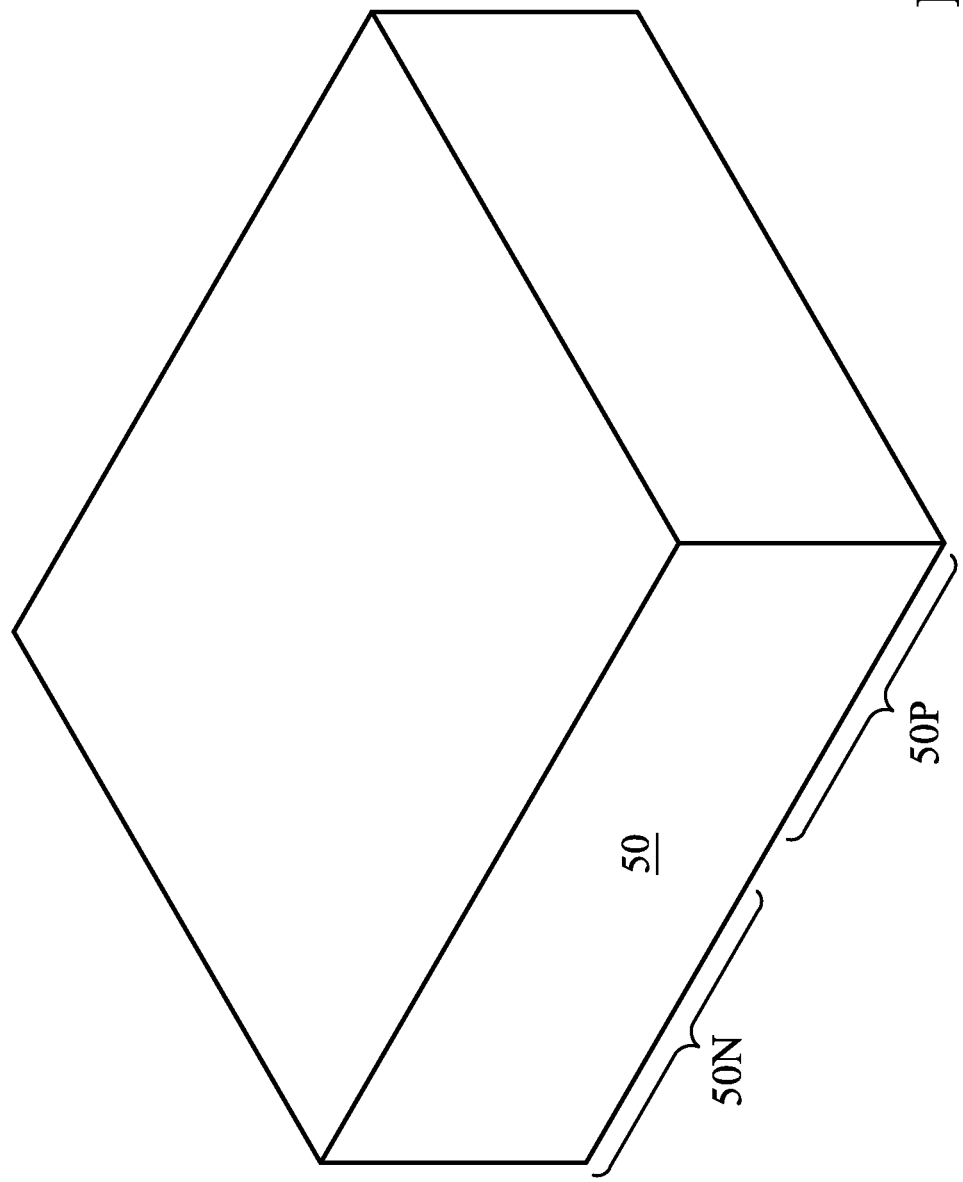
FIGS. 2, 3, 4, and 5 are three-dimensional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Figure 3:
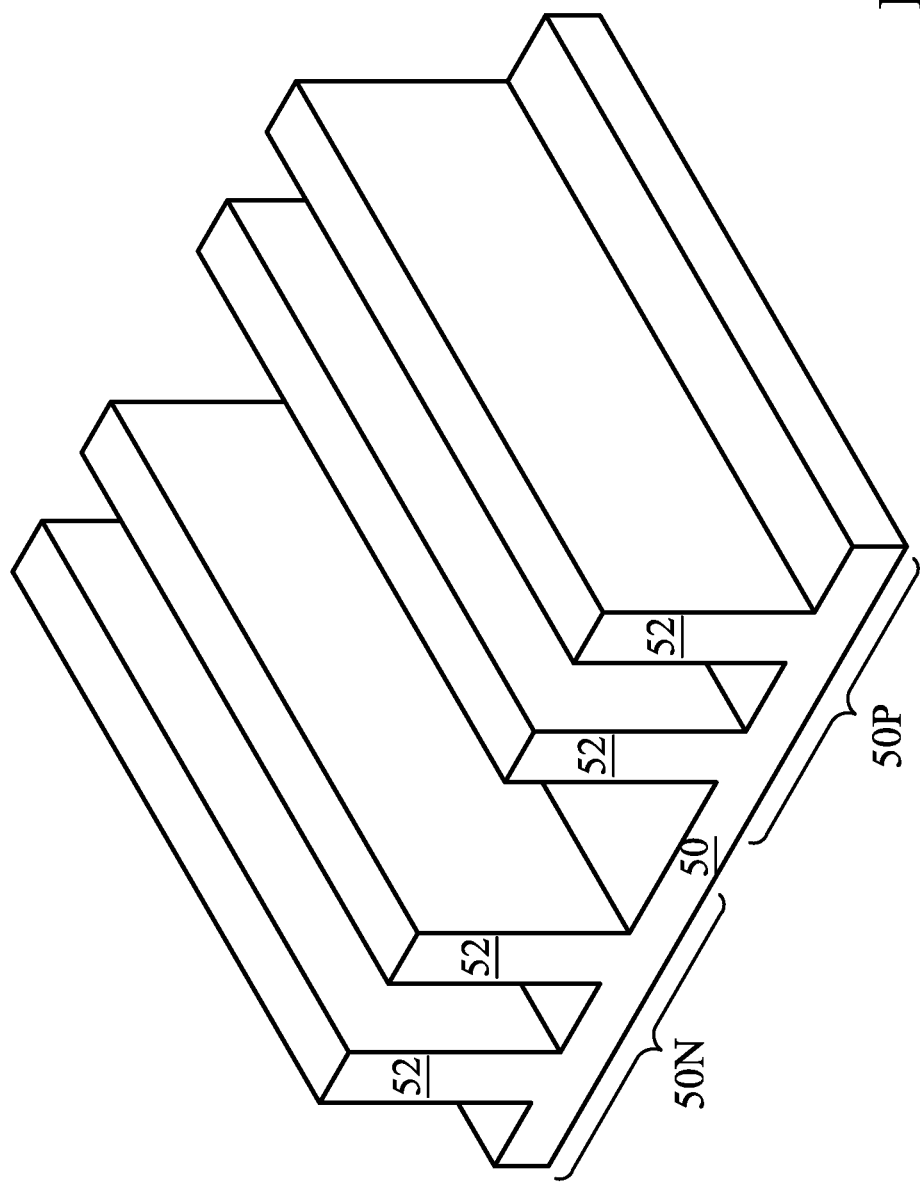

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
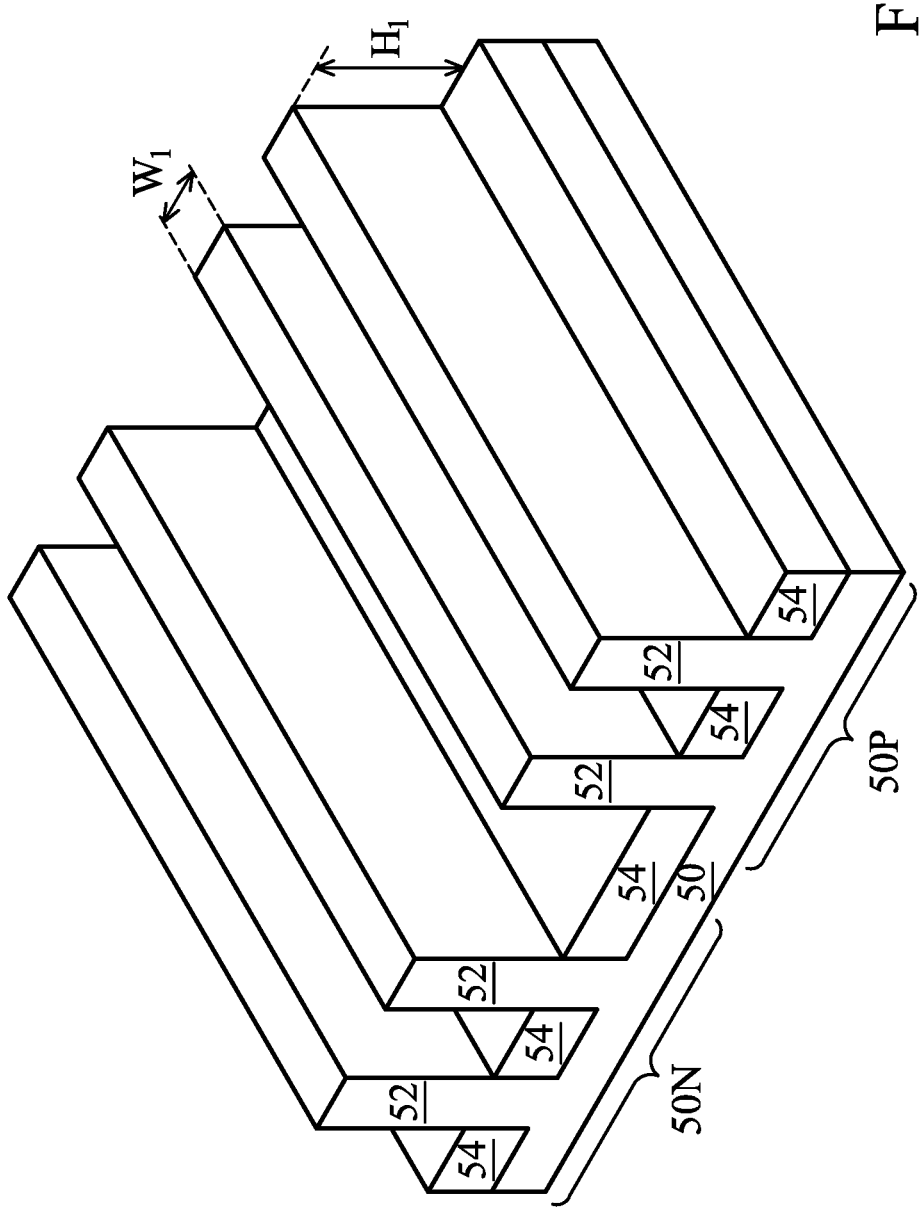

In FIG. 4, Shallow Trench Isolation (STI) regions 54 are formed over the substrate 50 and between neighboring fins 52. As an example to form the STI regions 54, an insulation material is formed over the intermediate structure. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Although the insulation material is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

A removal process is then applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete.

The insulation material is then recessed to form the STI regions 54. The insulation material is recessed such that upper portions of the fins 52 in the region 50N and in the region 50P protrude from between neighboring STI regions 54. The upper portions of the fins 52 have a width $W_1$ and a height $H_1$ after the recessing. The width $W_1$ and a height $H_1$ are the untrimmed width and height of the fins 52, and will be subsequently reduced during a fin trim process (discussed further below). In some embodiments, the untrimmed width $W_1$ is in the range of from about 3 nm to about 10 nm, and the untrimmed height $H_1$ is in the range of from about 10 nm to about 90 nm. Further, the top surfaces of the STI regions 54 may have a flat surface as illustrated, a convex surface, a concave surface (such as dishing), or a combination thereof. The top surfaces of the STI regions 54 may be formed flat, convex, and/or concave by an appropriate etch. The STI regions 54 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 54 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 54 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 54 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 5:
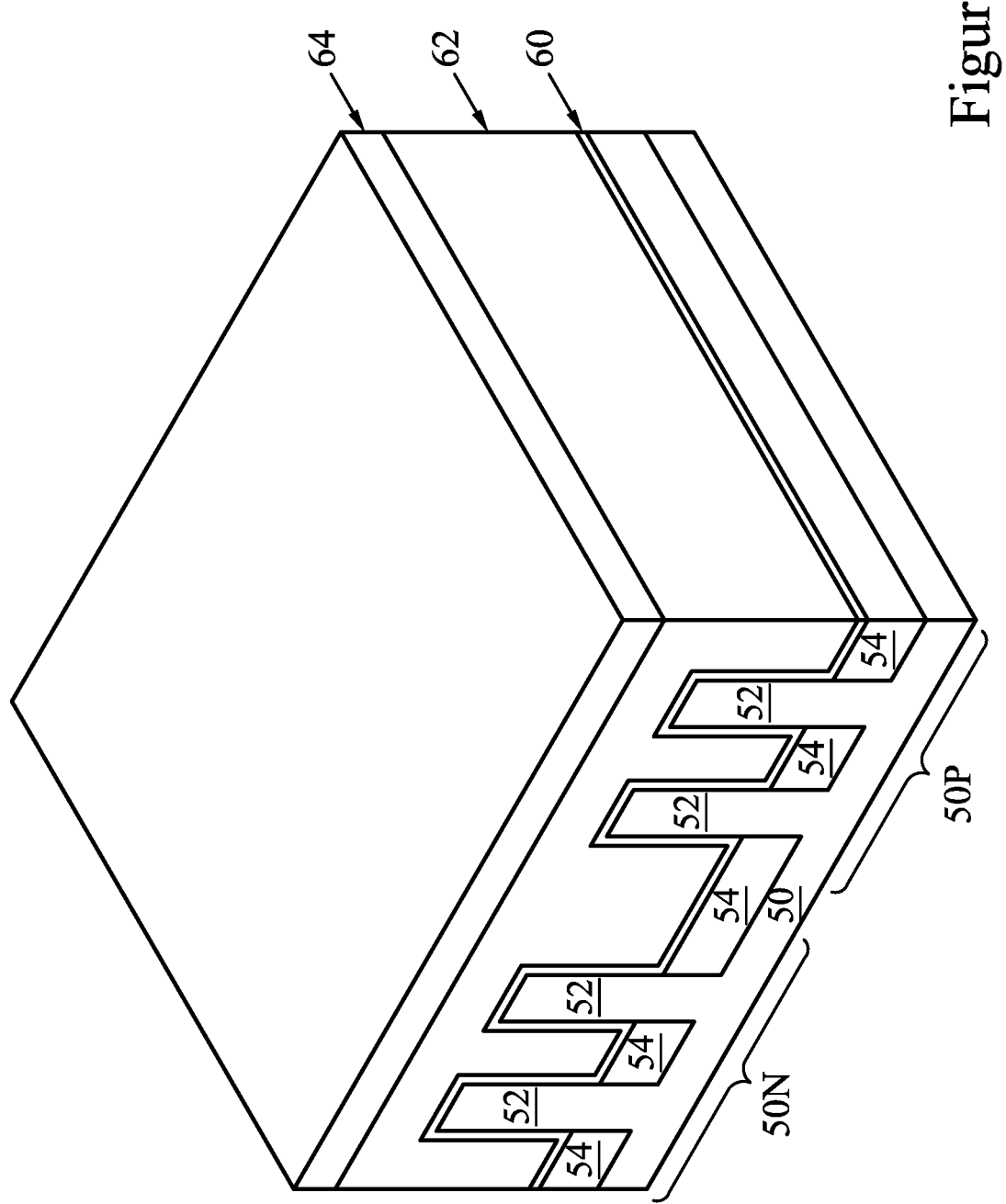

In FIG. 5, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy dielectric layer 60, a single dummy gate layer 62, and a single mask layer 64 are formed across the region 50N and the region 50P, covering the STI regions 54. It is noted that the layers are shown for illustrative purposes only. In some embodiments, the dummy dielectric layer 60 may not be a continuous layer, but rather may be formed covering only the fins 52.

FIGS. 6A through 15B are cross-sectional views of further intermediate stages in the manufacturing of FinFETs, in accordance with some embodiments. FIGS. 6A, 7A, 8A, 9A, 10A, 11A, 12A, 14A, and 15A are illustrated along reference cross-section A-A illustrated in FIG. 1. FIGS. 6B, 7B, 8B, 9B, 10B, 11B, 12B, 14B, and 15B are illustrated along reference cross-section B-B illustrated in FIG. 1, and only illustrate features in either of the region 50N and the region 50P. For example, the structures illustrated may be applicable to both the region 50N and the region 50P. Differences (if any) in the structures of the region 50N and the region 50P are described in the text accompanying each figure. FIGS. 8C and 8D are illustrated along reference cross-section C-C illustrated in FIG. 1.

Figure 6A:
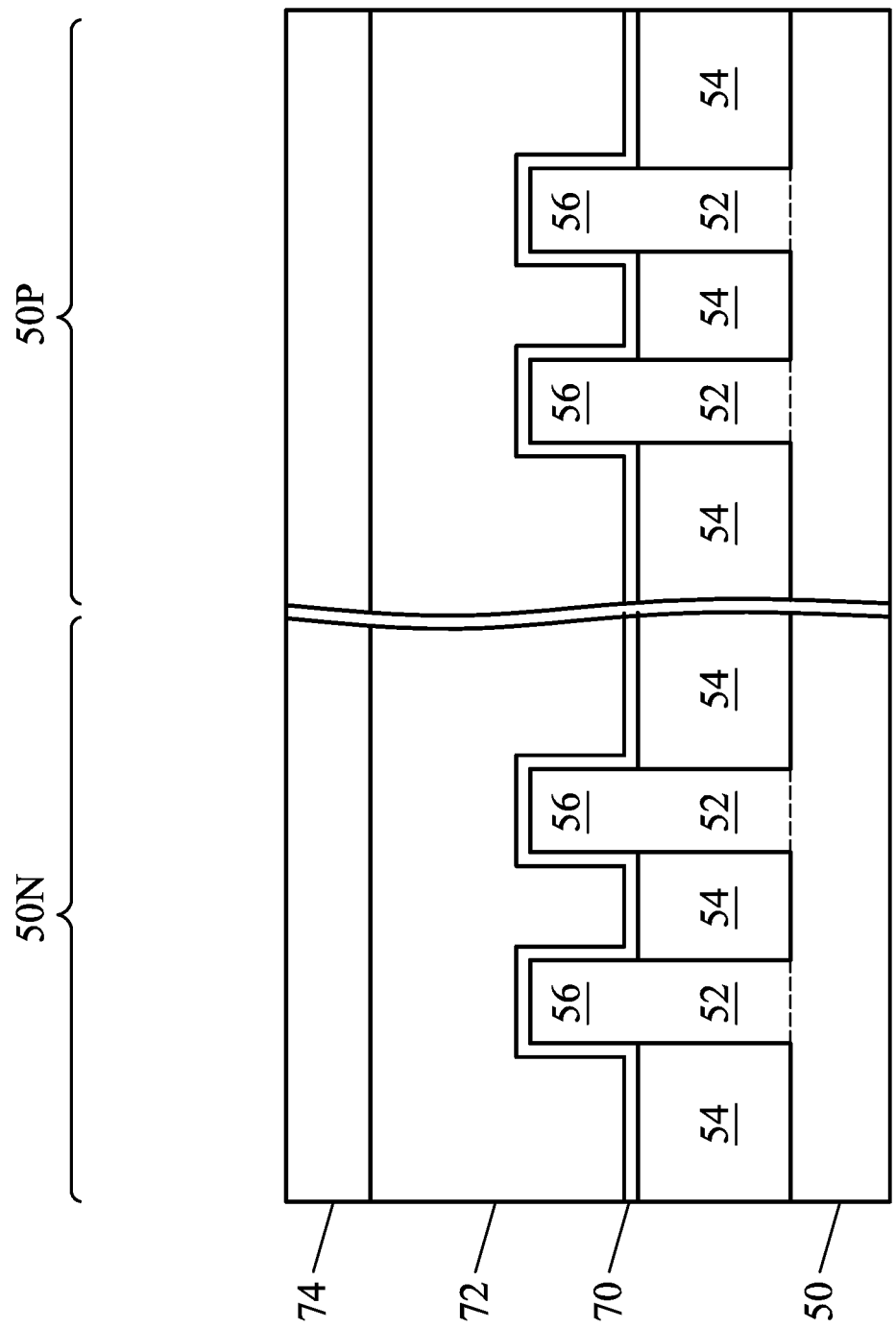
FIGS. 6A, 6B, 7A, 7B, 8A, 8B, 8C, 8D, 9A, 9B, 10A, 10B, 11A, 11B, 11C, 12A, 12B, 12C, 13A, 13B, 13C, 14A, 14B, 14C, 15A, and 15B are cross-sectional views of intermediate stages in the manufacturing of FinFETs, in accordance with some embodiments.
Figure 6B:
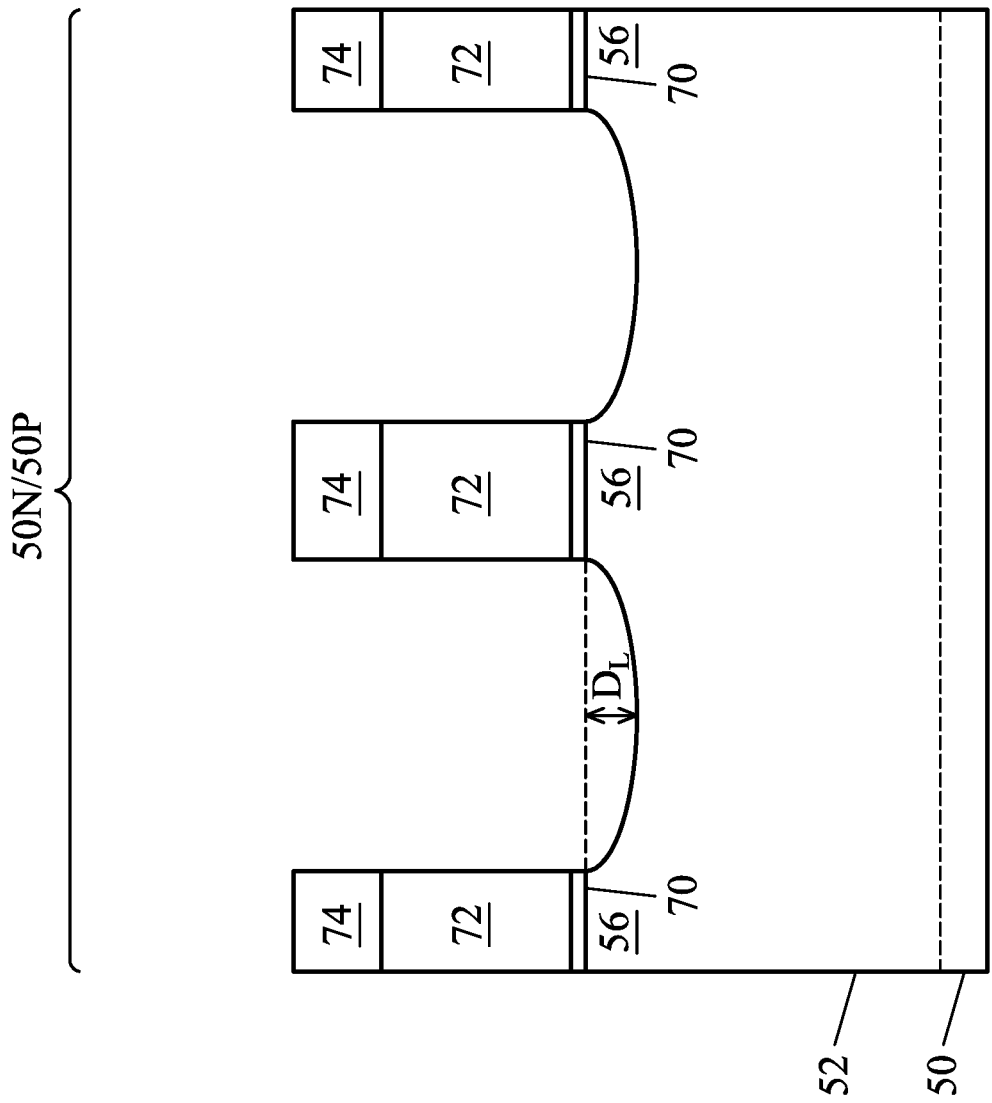

In FIGS. 6A and 6B, the mask layer 64 is patterned using acceptable photolithography and etching techniques to form masks 74. The pattern of the masks 74 is then transferred to the dummy gate layer 62 by an acceptable etching technique to form dummy gates 72. The pattern of the masks 74 is further transferred to the dummy dielectric layer 60 to form dummy gate dielectrics 70. The dummy gates 72 cover respective channel regions 56 of the fins 52. The pattern of the masks 74 may be used to physically separate each of the dummy gates 72 from adjacent dummy gates. The dummy gates 72 may also have a lengthwise direction substantially perpendicular to the lengthwise direction of the fins 52.

The dummy dielectric layer 60 and fins 52 have a high etch selectivity relative the etching processes for patterning of the dummy gates 72 and dummy gate dielectrics 70. Although some material of the fins 52 may be removed during the etching, the amount removed may be small. For example, in some embodiments, exposed portions of the fins 52 suffer a height loss of a distance $D_L$ in the range of from about 0.2 nm to about 2 nm, which may be from about 0.5% to about 15% of the untrimmed height $H_1$. Exposed surfaces of the fins 52 may thus be recessed below the dummy gate dielectrics 70.

Figure 7A:
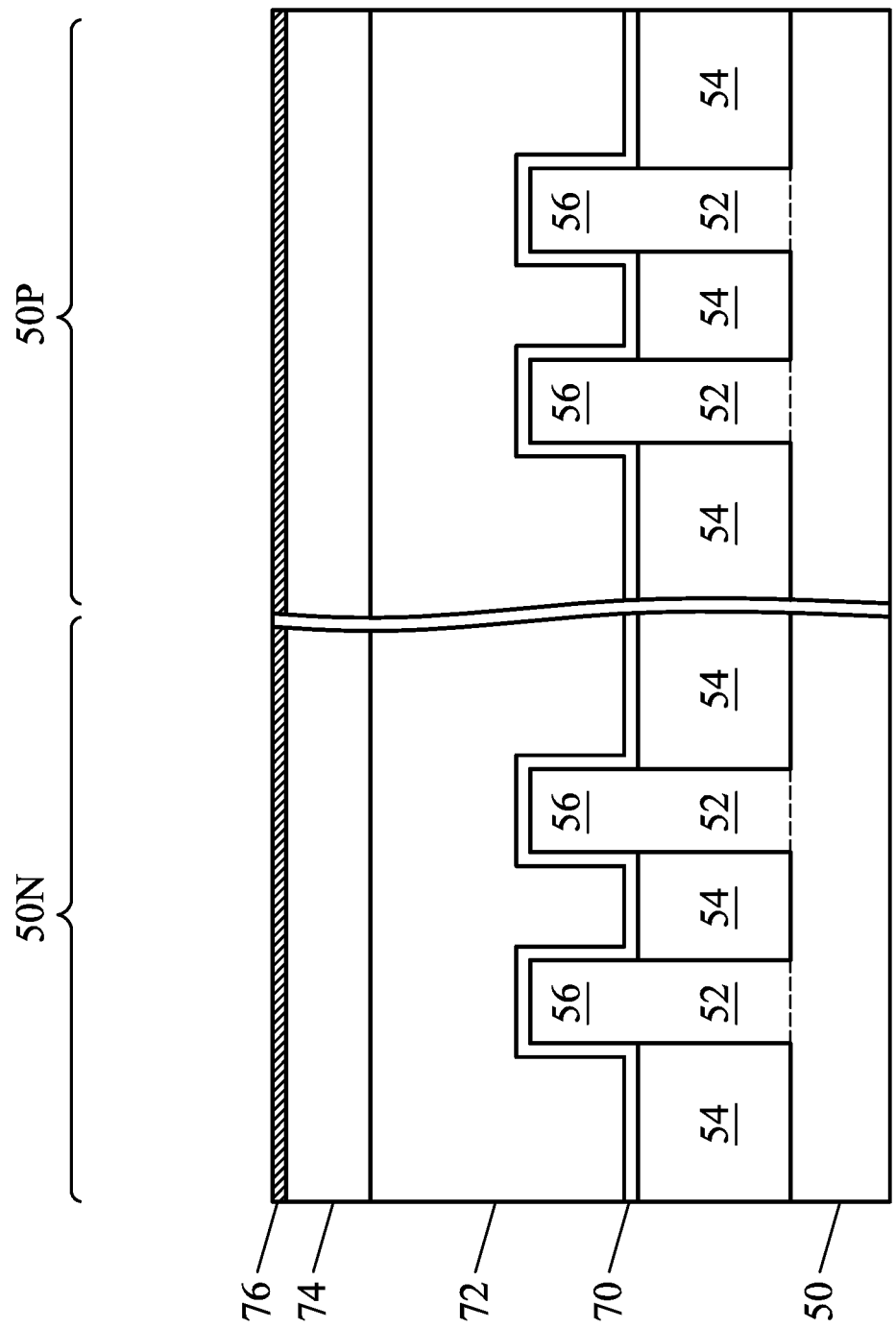
Figure 7B:
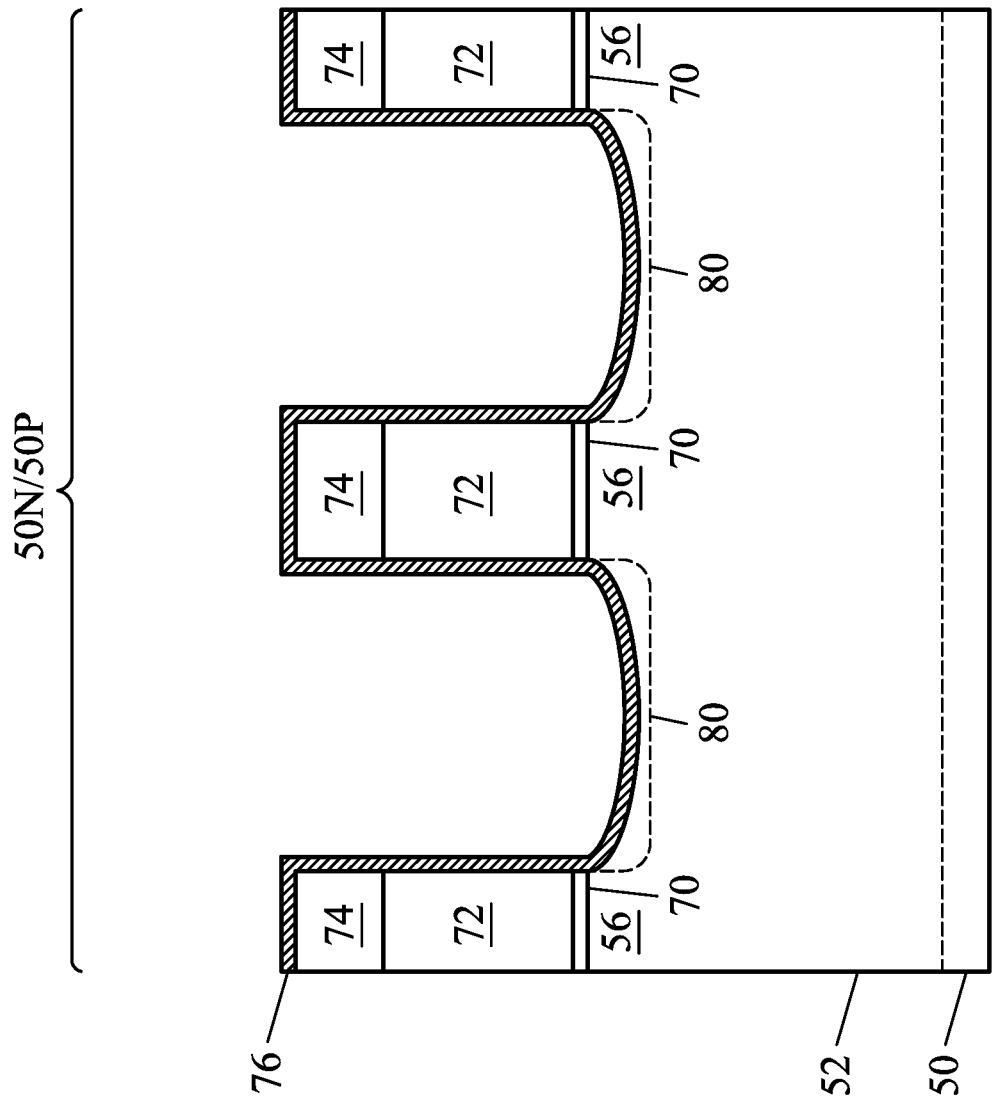

In FIGS. 7A and 7B, a gate spacer layer 76 is formed by conformally depositing an insulating material on exposed surfaces of the dummy gates 72, the masks 74, the STI regions 54, and/or the fins 52. The insulating material may be formed from silicon oxide, silicon nitride, silicon carbonitride, a combination thereof, or the like. In some embodiments, the gate spacer layer 76 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer. Due to the height loss suffered by the fins 52, the fins 52 have concave topmost surfaces between the dummy gates 72. Portions of the gate spacer layer 76 extending over the fins 52 also have the concave shape.

After the formation of the gate spacer layer 76, implants for lightly doped source/drain (LDD) regions 80 in the fins 52 may be performed. In the embodiments with different device types, similar to the implants discussed above, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The LDD regions 80 may have a concentration of impurities of from about $10^{15}$ cm$^{-3}$ to about $10^{16}$ cm$^{-3}$. An anneal may be used to activate the implanted impurities. Due to the height loss suffered by the fins 52, the fins 52 have concave topmost surfaces between the dummy gates 72. The LDD regions 80 thus also have concave topmost surfaces.

Figure 8A:
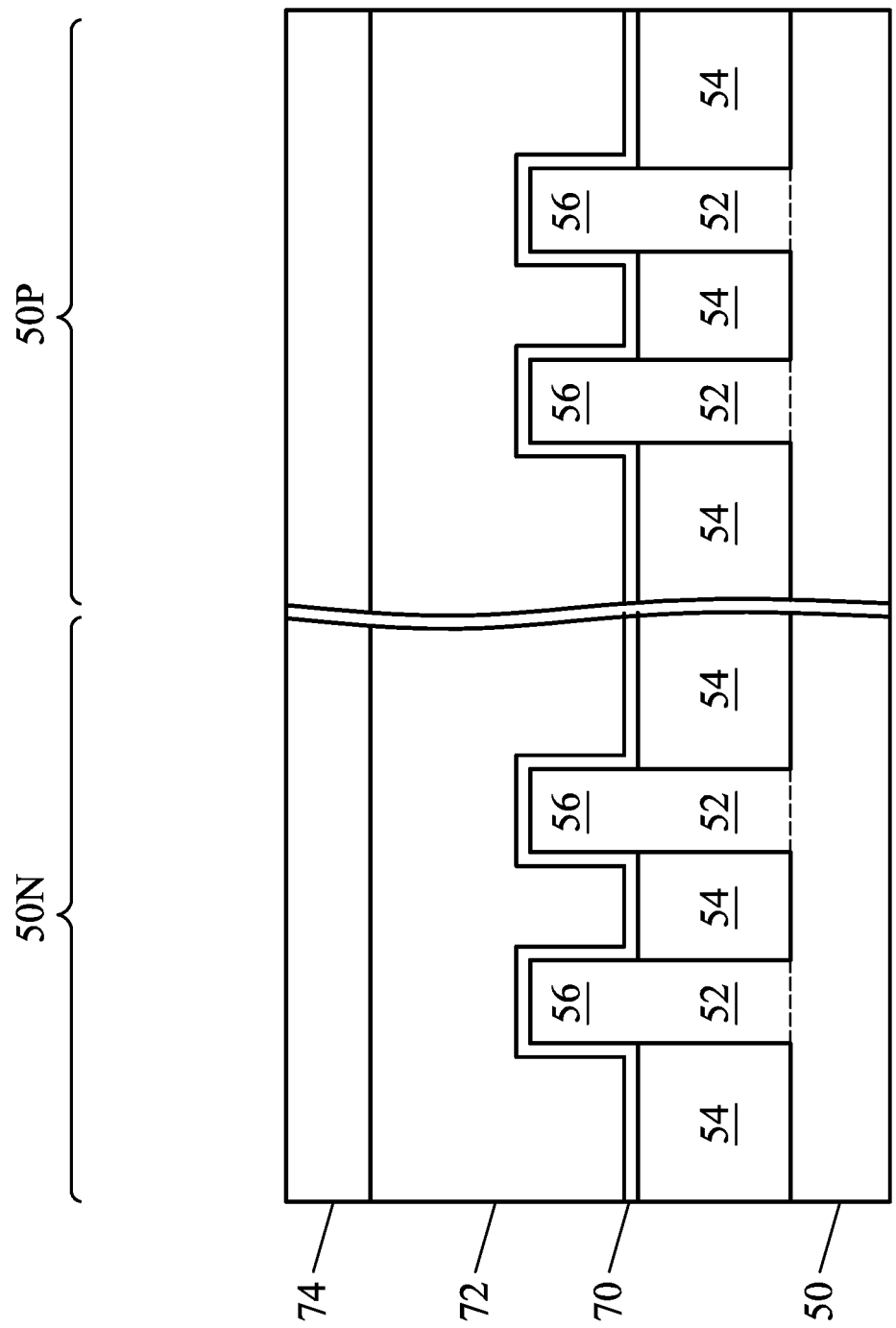
Figure 8B:
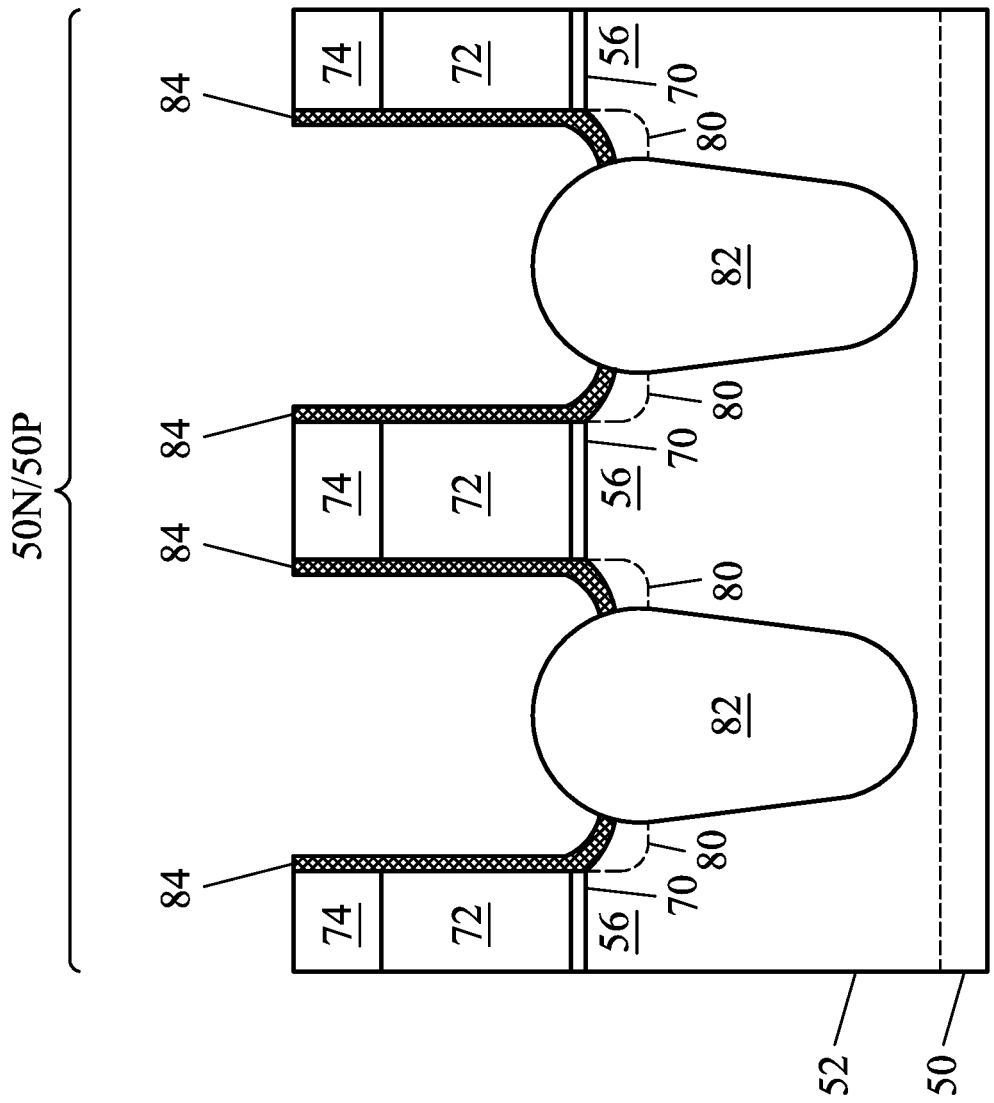

In FIGS. 8A and 8B, epitaxial source/drain regions 82 are formed in the fins 52. The epitaxial source/drain regions 82 may exert stress in the respective channel regions 56, thereby improving performance. The epitaxial source/drain regions 82 are formed in the fins 52 such that each dummy gate 72 is disposed between respective neighboring pairs of the epitaxial source/drain regions 82. The epitaxial source/drain regions 82 may have flat top surfaces. In some embodiments the epitaxial source/drain regions 82 may extend into, and may also penetrate through, the fins 52. In some embodiments, the gate spacer layer 76 is used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses. The recesses are formed using acceptable etching techniques, such as an anisotropic etch performed with (or without) a mask layer (not shown). The recesses extend through the gate spacer layer 76, through the mask layer if present, and into the fins 52. The etching of the recesses also removes some portions of the gate spacer layer 76, such as portions overlying the dummy gates 72. Remaining portions of the gate spacer layer 76 in the region 50N form gate spacers 84. The epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 56, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses. The recesses are formed using acceptable etching techniques, such as an anisotropic etch performed with (or without) a mask layer (not shown). The recesses extend through the gate spacer layer 76, through the mask layer (when present), and into the fins 52. The etching of the recesses also removes some portions of the gate spacer layer 76, such as portions overlying the dummy gates 72. Remaining portions of the gate spacer layer 76 in the region 50P form gate spacers 84. The epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 56, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 8C:
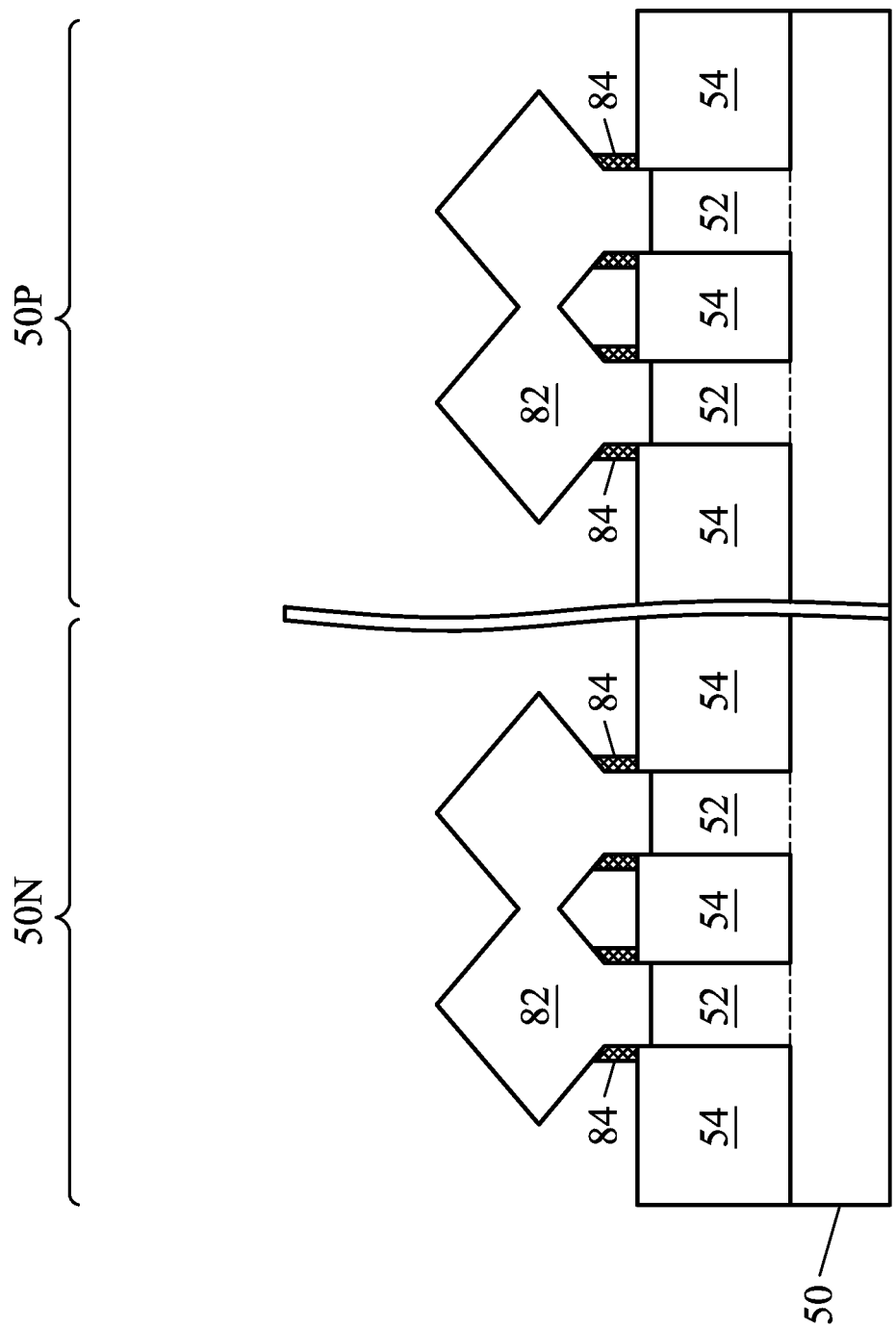
Figure 8D:
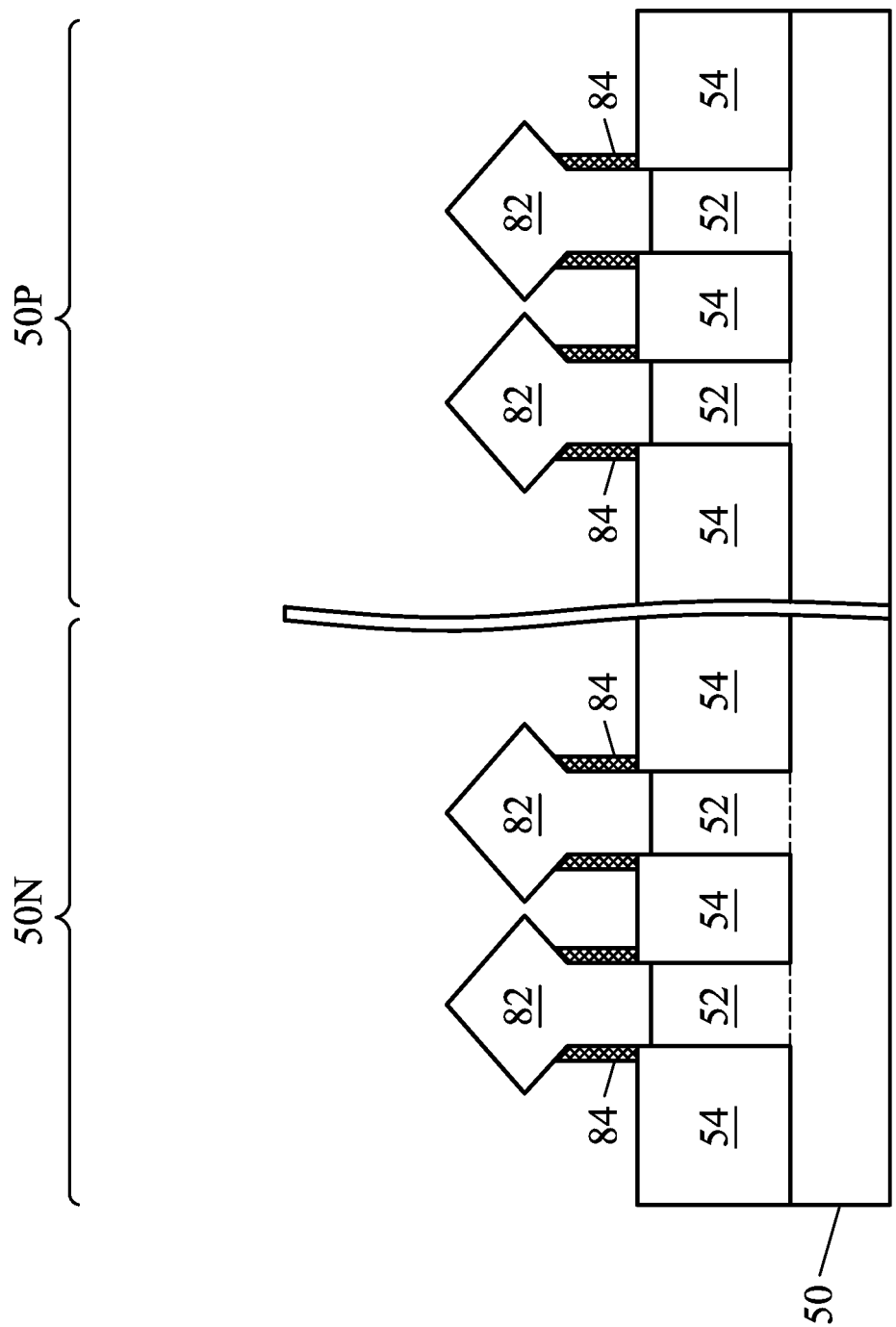

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 8C. In other embodiments, adjacent epitaxial source/drain regions 82 remain separated after the epitaxy process is completed as illustrated by FIG. 8D.

Figure 9A:
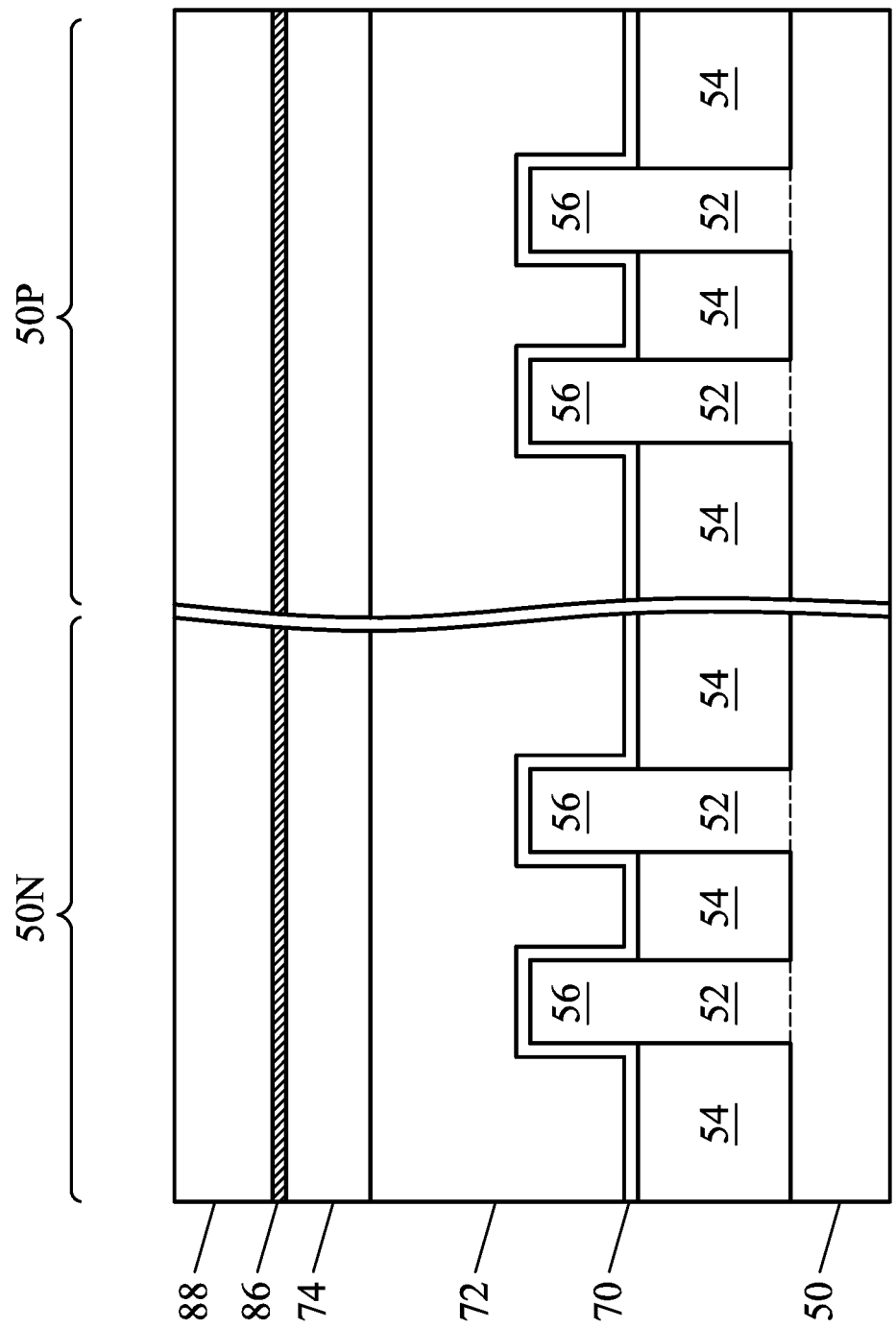
Figure 9B:
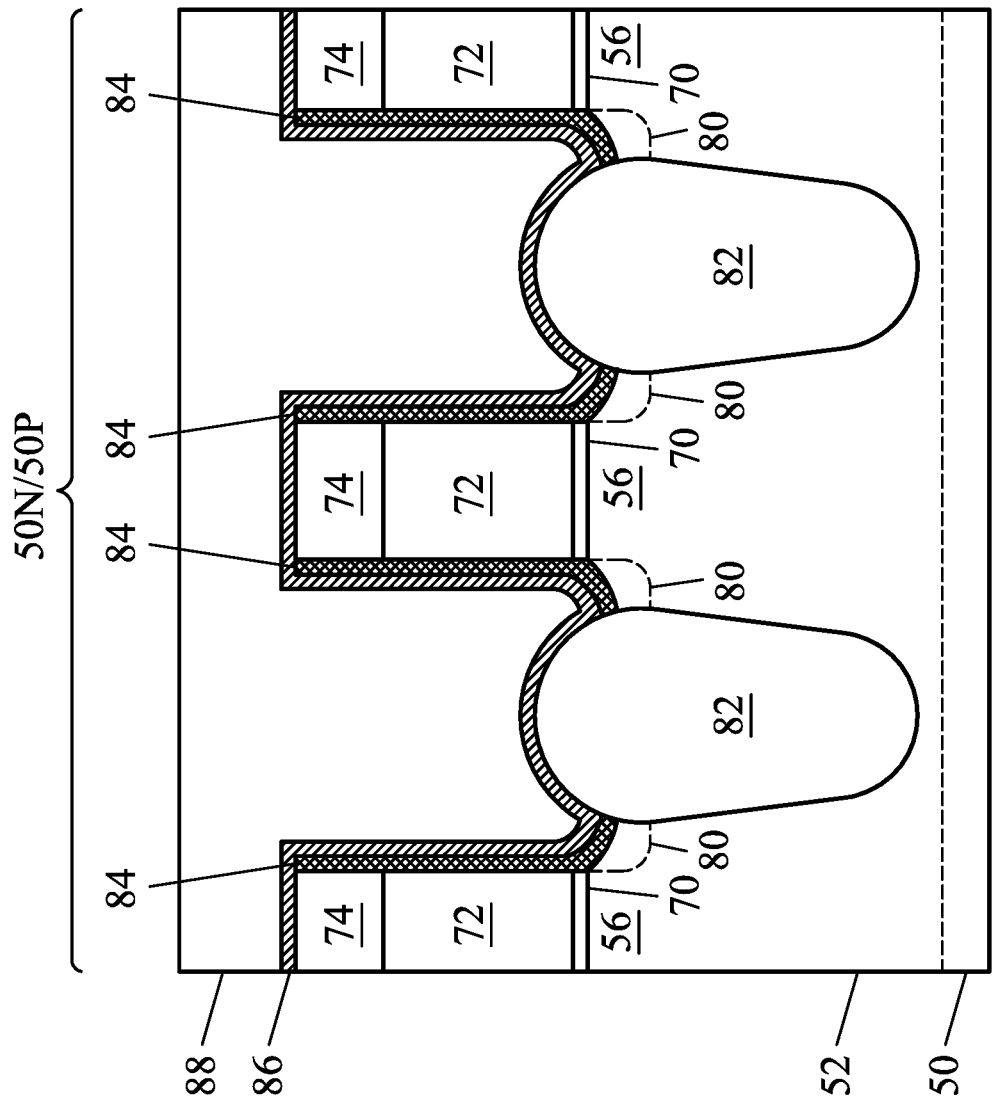

In FIGS. 9A and 9B, a first inter-layer dielectric (ILD) 88 is deposited over the intermediate structure. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 86 is disposed between the first ILD 88 and the epitaxial source/drain regions 82, the masks 74, and the gate spacers 84. The CESL 86 may comprise a dielectric material, such as, silicon nitride, silicon oxide, silicon oxynitride, or the like, having a different etch rate than the material of the overlying first ILD 88.

Figure 10A:
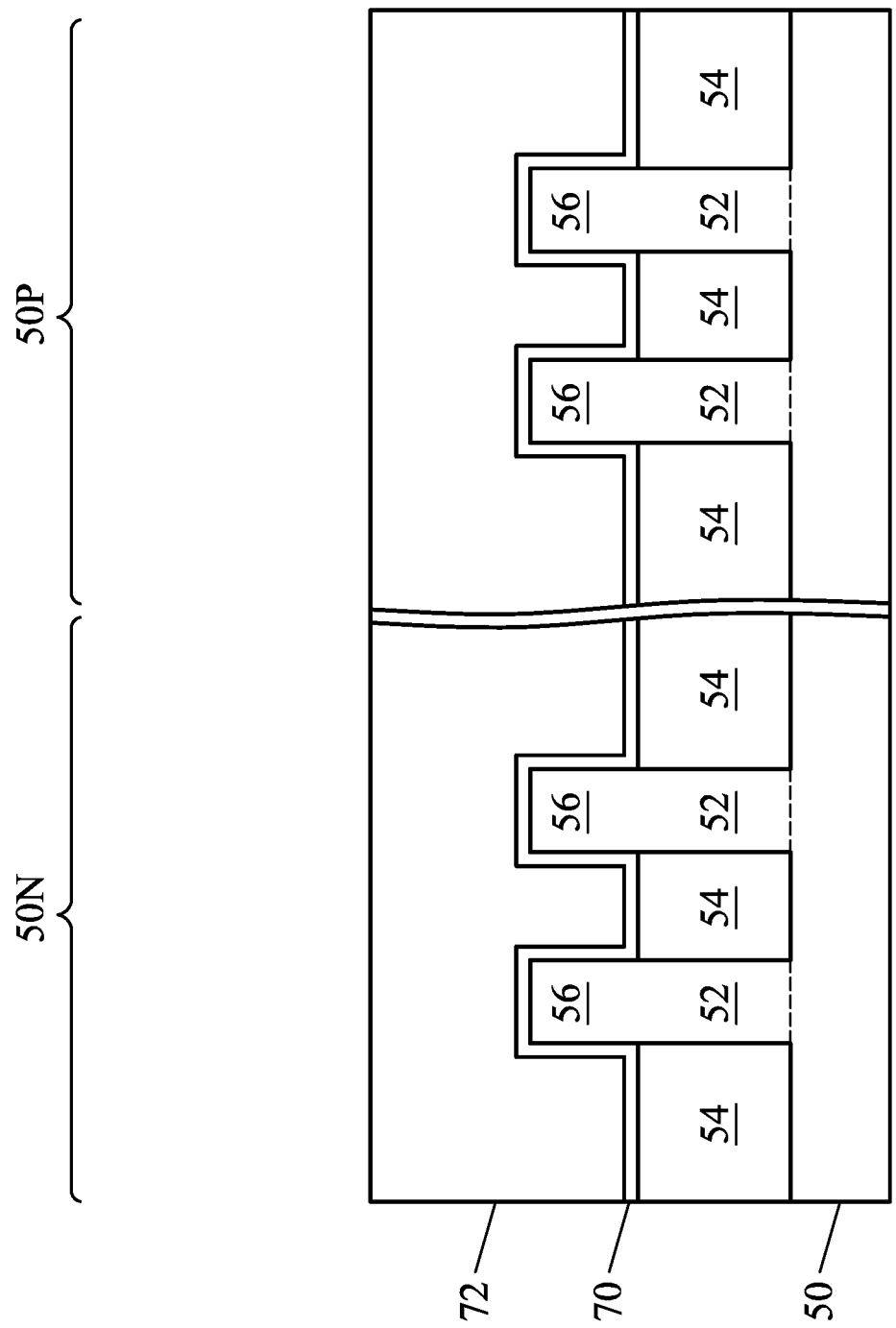
Figure 10B:
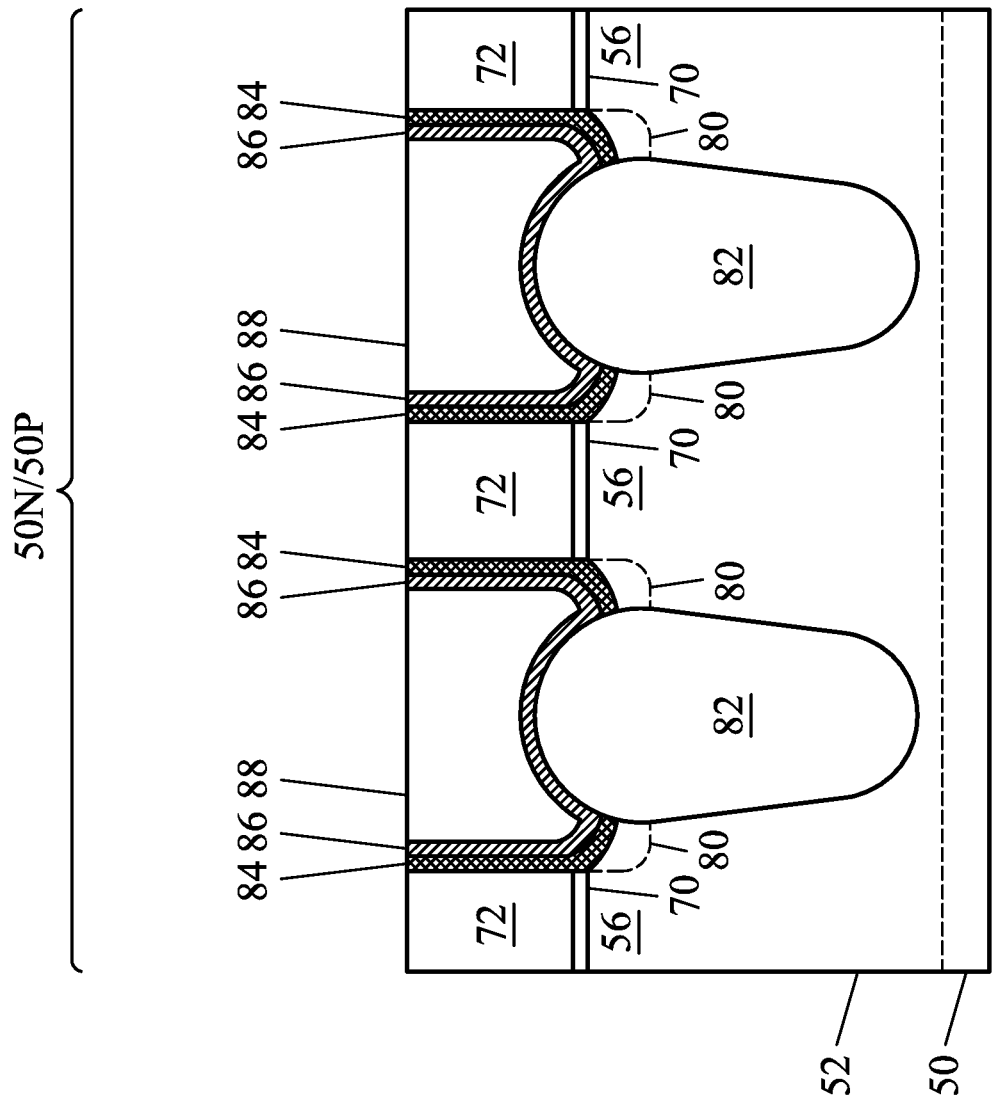

In FIGS. 10A and 10B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate spacers 84 along sidewalls of the masks 74. After the planarization process, top surfaces of the dummy gates 72, the gate spacers 84, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 11A:
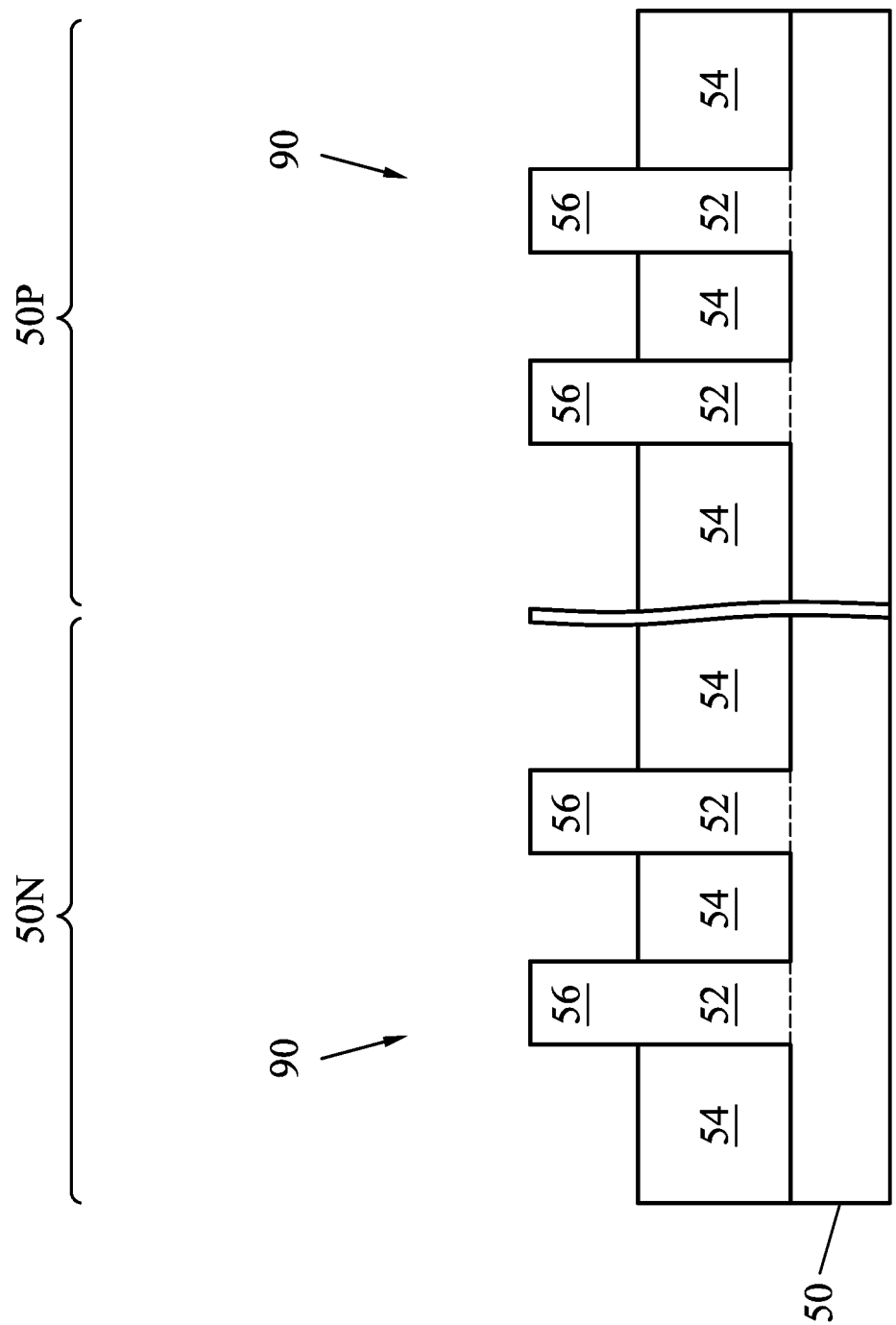
Figure 11B:
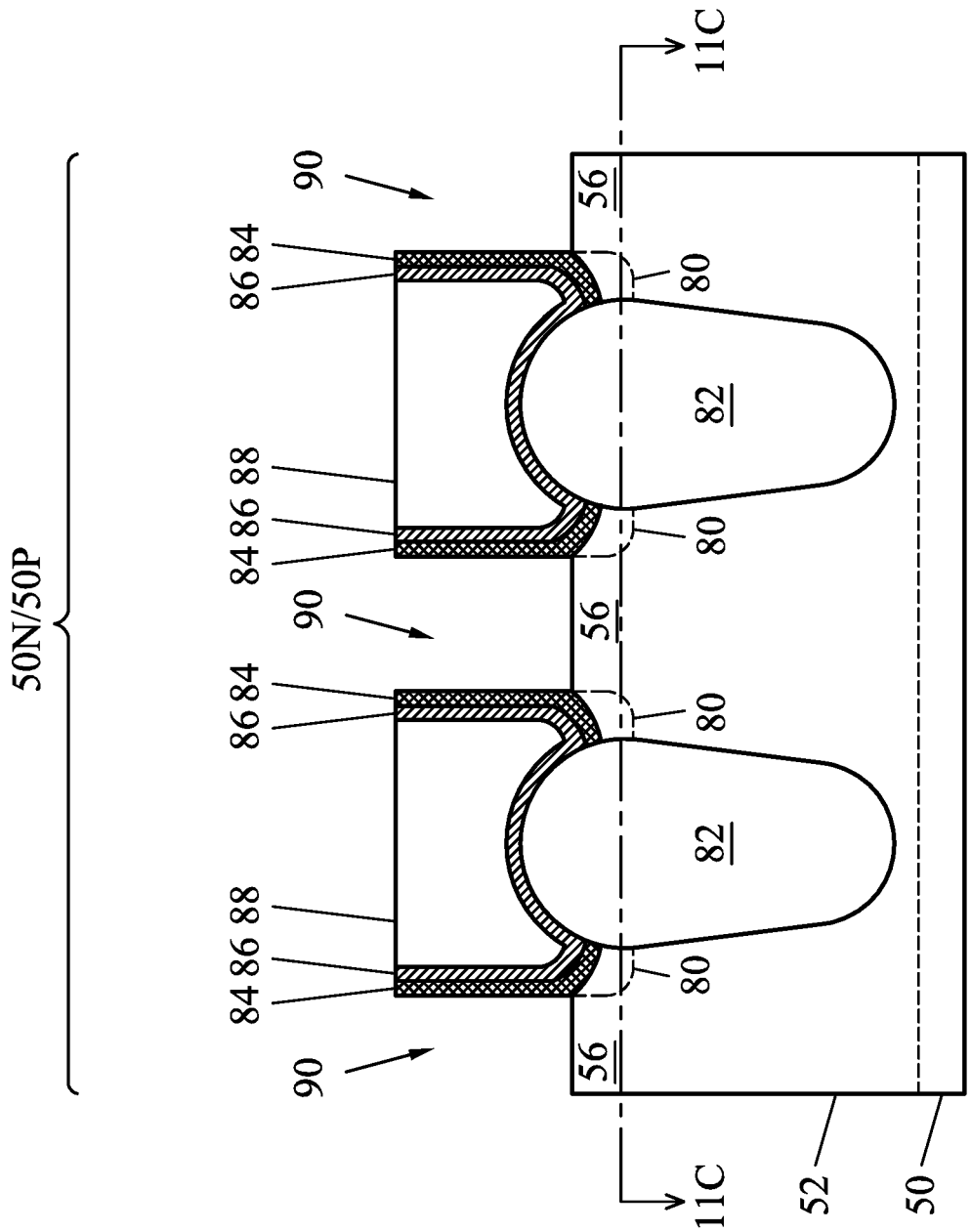
Figure 11C:
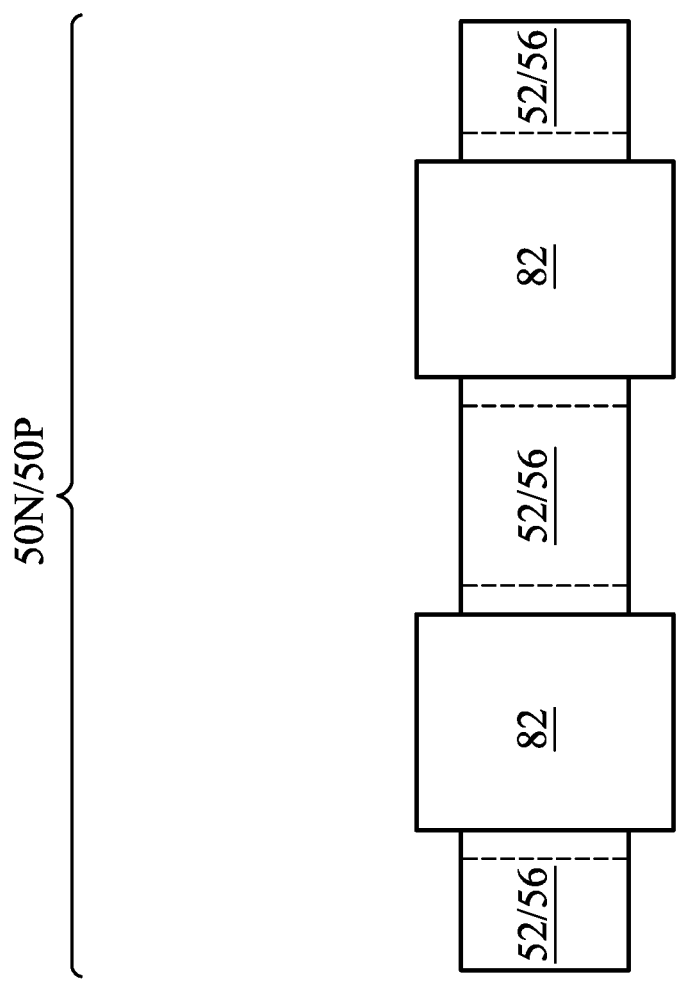

In FIGS. 11A and 11B, the dummy gate dielectrics 70, dummy gates 72, and the masks 74 if present, are removed in an etching step(s), so that recesses 90 are formed. FIG. 11C is a cross-sectional view illustrated along reference cross-section 11C-11C, and is described in conjunction with FIGS. 11A and 11B. The dummy gate dielectrics 70 in the recesses 90 may also be removed. In some embodiments, only the dummy gates 72 are removed and the dummy gate dielectrics 70 remains and are exposed by the recesses 90. In some embodiments, the dummy gate dielectrics 70 are removed from recesses 90 in a first region of a die (e.g., a core logic region) and remain in recesses 90 in a second region of the die (e.g., an input/output region). Each recess 90 exposes a channel region 56 of a respective fin 52. Each channel region 56 is disposed between neighboring pairs of the epitaxial source/drain regions 82. In some embodiments, the etching step(s) include a first etching process for removing the dummy gates 72 and a second etching process for removing the dummy gate dielectrics 70. In some embodiments, the first etching process is an anisotropic dry etch process. For example, the first etching process may include a dry etch process using reaction gas(es) that selectively etch the dummy gates 72 without etching the first ILD 88 or the gate spacers 84. In some embodiments, the second etching process is dry or wet etch, and may be anisotropic. During the removal, the dummy gate dielectrics 70 may be used as etch stop layers when the dummy gates 72 are etched.

As noted above, the fins 52 have an untrimmed width $W_1$, and the dummy gate dielectrics 70 are used as etch stop layers when the dummy gates 72 are etched. Further, in accordance with some embodiments, fin trim processes are omitted before removal of the dummy gate dielectrics 70. As such, the fins 52 (including the LDD regions 80) retain the untrimmed width $W_1$ and untrimmed height $H_1$ after removal of the dummy gate dielectrics 70.

Figure 12A:
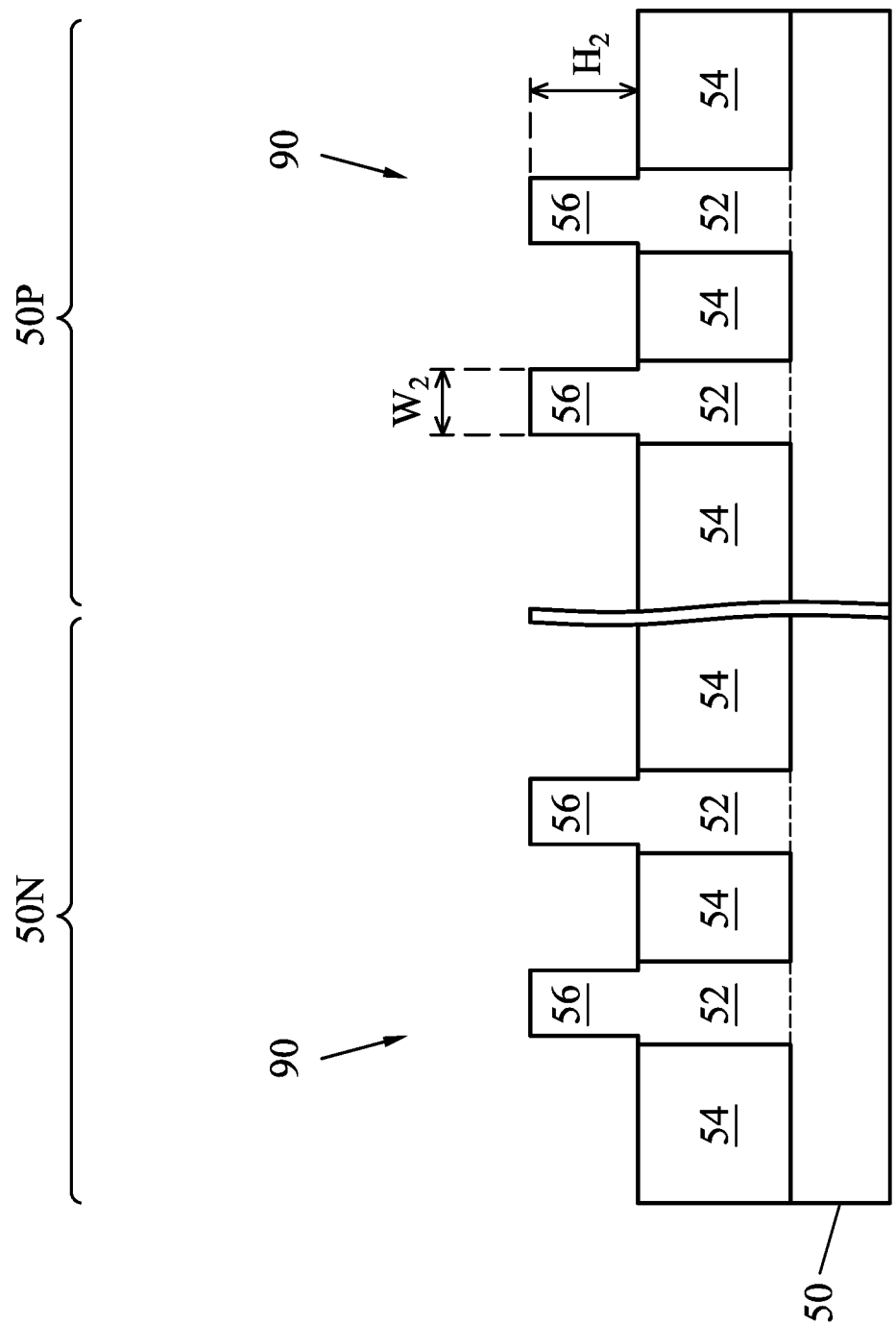
Figure 12B:
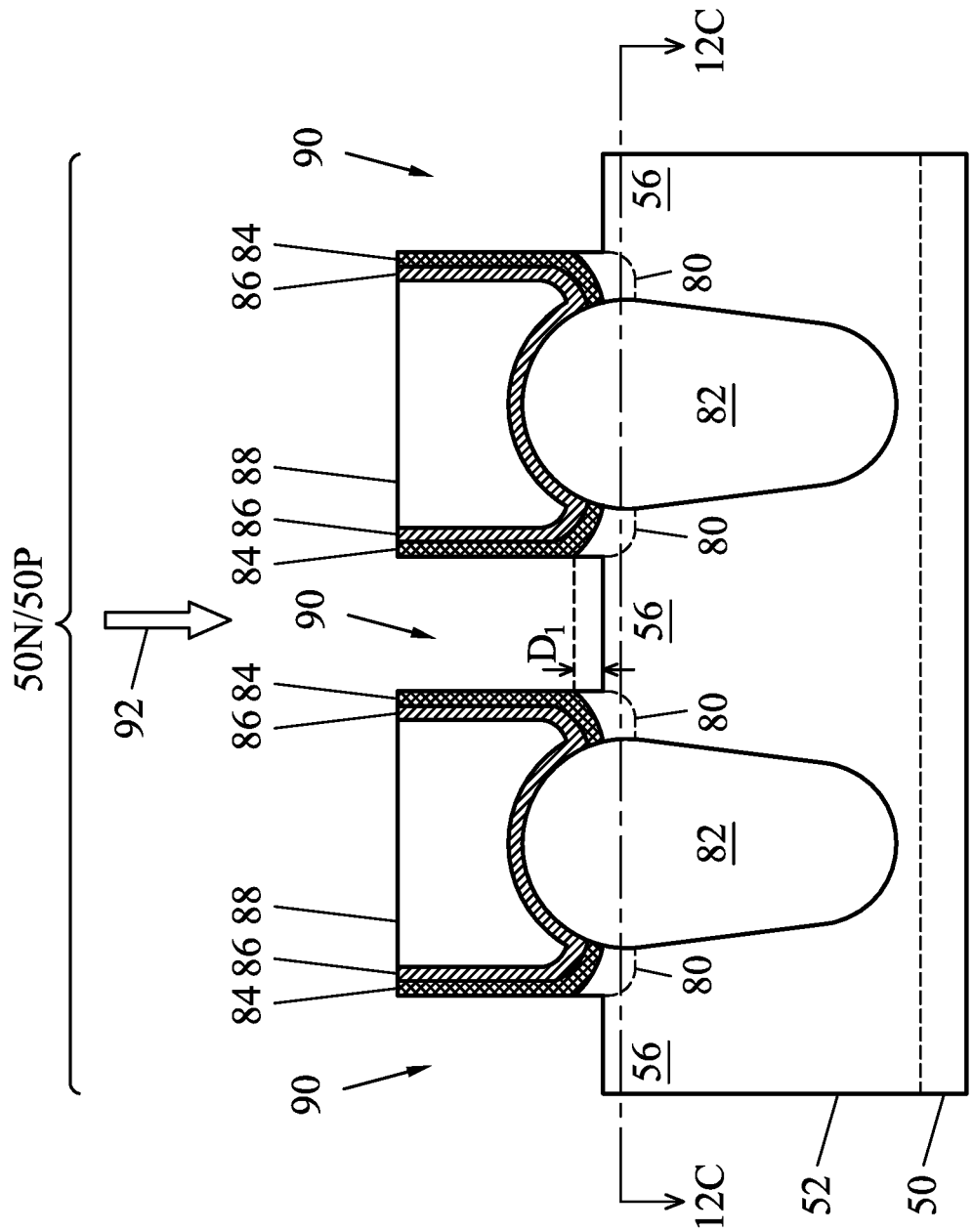
Figure 12C:
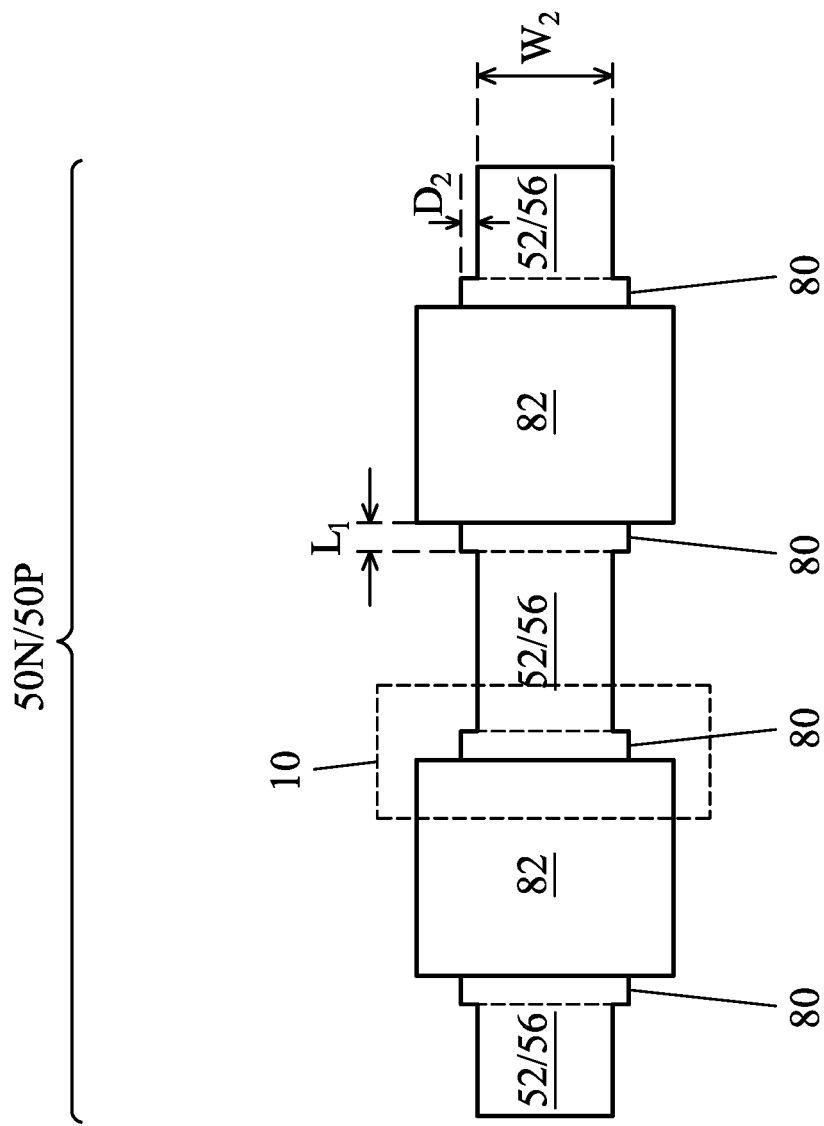

In FIGS. 12A and 12B, a fin trim process 92 is performed to reduce the width and height of exposed portions of the fins 52. FIG. 12C is a cross-sectional view illustrated along reference cross-section 12C-12C, and is described in conjunction with FIGS. 12A and 12B. During the fin trim process 92, the exposed channel regions 56 of the fins 52 are etched. Notably, the fin trim process 92 is selective to the channel regions 56 of the fins 52, e.g., to the undoped material of the fins 52. As such, the LDD regions 80 may substantially retain their untrimmed width $W_1$ and untrimmed height $H_1$ after the fin trim process 92. Topmost surfaces of the LDD regions 80 may thus extend above topmost surfaces of the channel regions 56 in a cross-sectional view, and widths of the LDD regions 80 are thus greater than widths of the channel regions 56 in a top-down view. Trimming the fins 52 may help enhance the gate control of the resulting FinFETs and reduce the short channel effect (SCE) in the resulting FinFETs.

In some embodiments, the fin trim process 92 includes performing multiple oxidation and etch cycles. Each cycle may be self-limiting. For example, during each oxidation cycle, a same amount of the fins 52 may be oxidized, and during each etch cycle, only the oxidized portions of the fins 52 are removed. The oxidation and etch cycles are repeated until a desired amount is trimmed from the channel regions 56 of the fins 52. For example, the oxidation and etch cycles may be cyclically repeated a predetermined quantity of times. The oxidation may be accomplished by any acceptable oxidation process, such as a native oxidation process, a thermal oxidation process, a rapid thermal oxidation (RTO) process, a chemical oxidation process, an in-situ stream generation (ISSG) process, or the like. For example, a thermal oxidation process such as a rapid thermal anneal (RTA) may be performed in an oxygen-containing environment. The thermal oxidation process may be performed at a temperature of from about 300° C. to about 1050° C., for a time span of from about 10 seconds to about 600 seconds. The temperature and time span may contribute to the amount of oxidation, where higher temperatures and longer time spans result in a greater amount of the fins 52 being oxidized. Other oxidation processes or a combination thereof may be performed. For example, a chemical oxidation process may be performed, where the fins 52 are exposed to a wet chemical oxidizer such as water. The water may be provided by bubbling a carrier gas through de ionized water maintained near the boiling point, and exposing the fins 52 to the saturated water vapor. The etching may be accomplished by any acceptable etching process, such as a wet etch, a dry etch, or combinations thereof. For example, a chemical oxide removal with a suitable etch process using, for example, dilute hydrofluoric (dHF) acid may be used.

In some embodiments, the fin trim process 92 includes performing one or more etch process(es). The etch process(es) are timed, and performed a predetermined amount of time. The etch process(es) may include a dry (e.g., plasma) etch process, a wet etch process, or a combination thereof, and may be selective to the undoped material of the fins 52 (e.g., silicon). A plasma etch process can include using a fluorocarbon ($C_xF_y$) gas, a chlorofluorocarbon ($C_xCl_yF_z$) gas, a carbon chloride ($C_xCl_y$) gas, hydrogen fluoride (HF) gas, hydrogen chloride (HCl) gas, hydrogen bromide (HBr) gas, chlorine ($Cl_2$) gas, the like or a combination thereof. A wet etch process can include using one or more solutions of standard clean-1 (SC1), standard clean-2 (SC2), sulfuric acid-hydrogen peroxide mixture (SPM), diluted hydrofluoric (dHF) acid, a buffered oxide etchant (BOE), the like, or a combination thereof. When a dry etch is used, it may be performed for a time span of from about 3 second to about 100 seconds, and when a wet etch is used, it may be performed for a time span of from about 3 second to about 60 seconds.

After the fin trim process 92, the channel regions 56 of the fins 52 have a trimmed height $H_2$ and a trimmed width $W_2$. The fin trim process 92 reduces the height of the fins 52 by a distance $D_1$, which may be from about 0.5% to about 15% of the untrimmed height $H_1$. For example, the fin trim process 92 may reduce the height of the fins 52 by a distance $D_1$ in the range of from about 0.2 nm to about 2 nm. In some embodiments, the trimmed height $H_2$ is in the range of from about 10 nm to about 90 nm. The fin trim process 92 reduces the width of the fins 52 by a distance $D_2$, which may be from about 0.5% to about 50% of the untrimmed width $W_1$. For example, the fin trim process 92 may reduce the width of the fins 52 by a distance $D_2$ in the range of from about 0.2 nm to about 5 nm. As noted above, trimming the fins 52 may help enhance the gate control of the resulting FinFETs and reduce the SCE in the resulting FinFETs. In some embodiments, the trimmed width $W_2$ is in the range of from about 2 nm to about 20 nm. The portions of the LDD regions 80 protruding from the epitaxial source/drain regions 82 have a length $L_1$ after the fin trim process 92. In some embodiments, the length $L_1$ is in the range of from about 0.2 nm to about 6 nm.

Figure 13A:
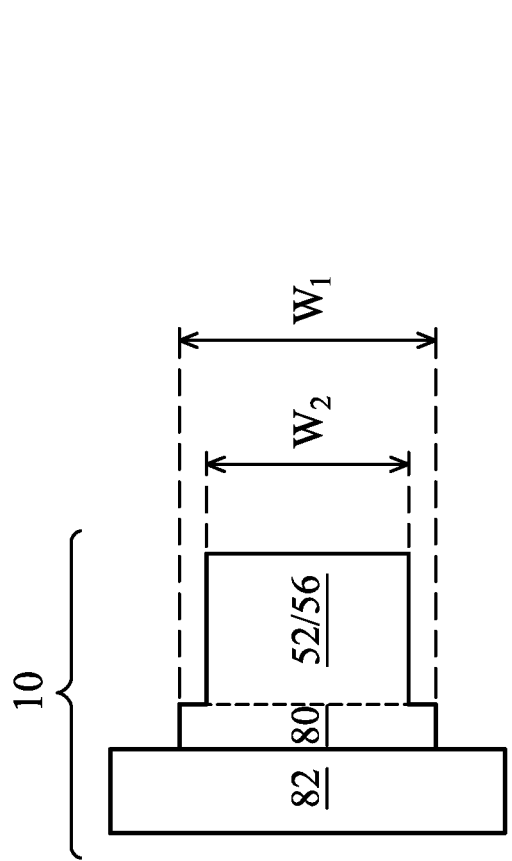
Figure 13B:
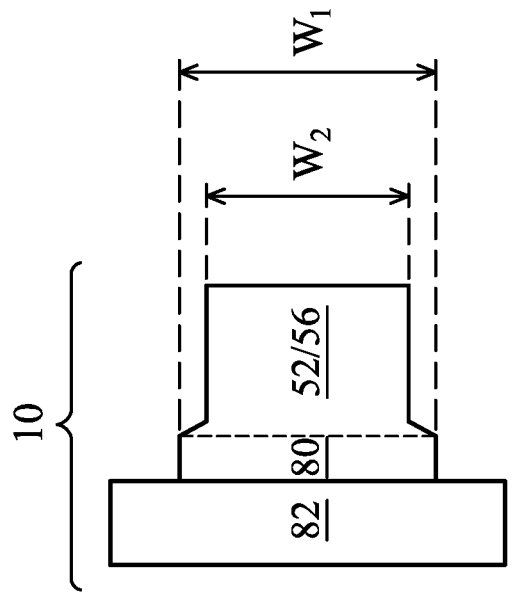
Figure 13C:
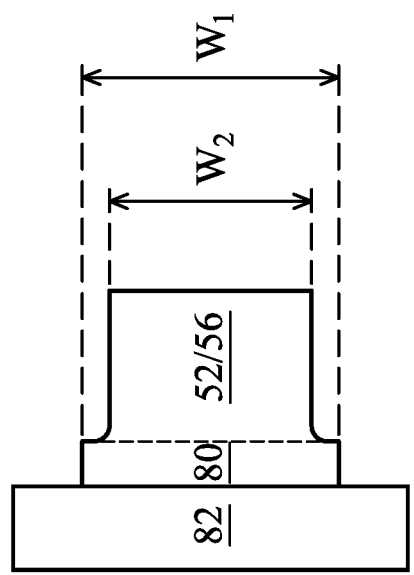

The transition from the width $W_1$ (e.g., at the LDD regions 80) to the width $W_2$ (e.g., at the channel regions 56) may have multiple possible interface shapes. FIGS. 13A, 13B, and 13C are detailed cross-sectional views of a region 10 illustrated in FIG. 12C, illustrating several types of interface shapes. The interface may be a step interface (see FIG. 13A) that includes one or more steps, a linear interface (see FIG. 13B), a curved interface (see FIG. 13C), or the like. Other interface shapes are possible.

Notably, the fin trim process 92 is performed after the dummy gate dielectrics 70 are removed. Delaying the fin trim process 92 until after the epitaxial source/drain regions 82 are formed allows the fins 52 to have a larger untrimmed width $W_1$ during the epitaxial growth process for forming the epitaxial source/drain regions 82. A greater growth surface is thus available during the epitaxial growth process, allowing epitaxial source/drain regions 82 of greater volume (and thus higher performance) to be formed with less defects. Further, as noted above, when patterning the dummy gates 72, the fins 52 may suffer a height loss of $D_L$ (see FIG. 6B). The height loss introduces a vertical gap between the epitaxial source/drain regions 82 and the channel regions 56 of the fins 52. The vertical gap may exacerbate current crowding effects in the channel regions 56, which may reduce performance of the resulting FinFETs in some applications (e.g., direct current applications, ring oscillator applications, etc.). Delaying the fin trim process 92 until after the epitaxial source/drain regions 82 are formed also allows the vertical gap to be reduced, thereby reducing current crowding effects.

Figure 14A:
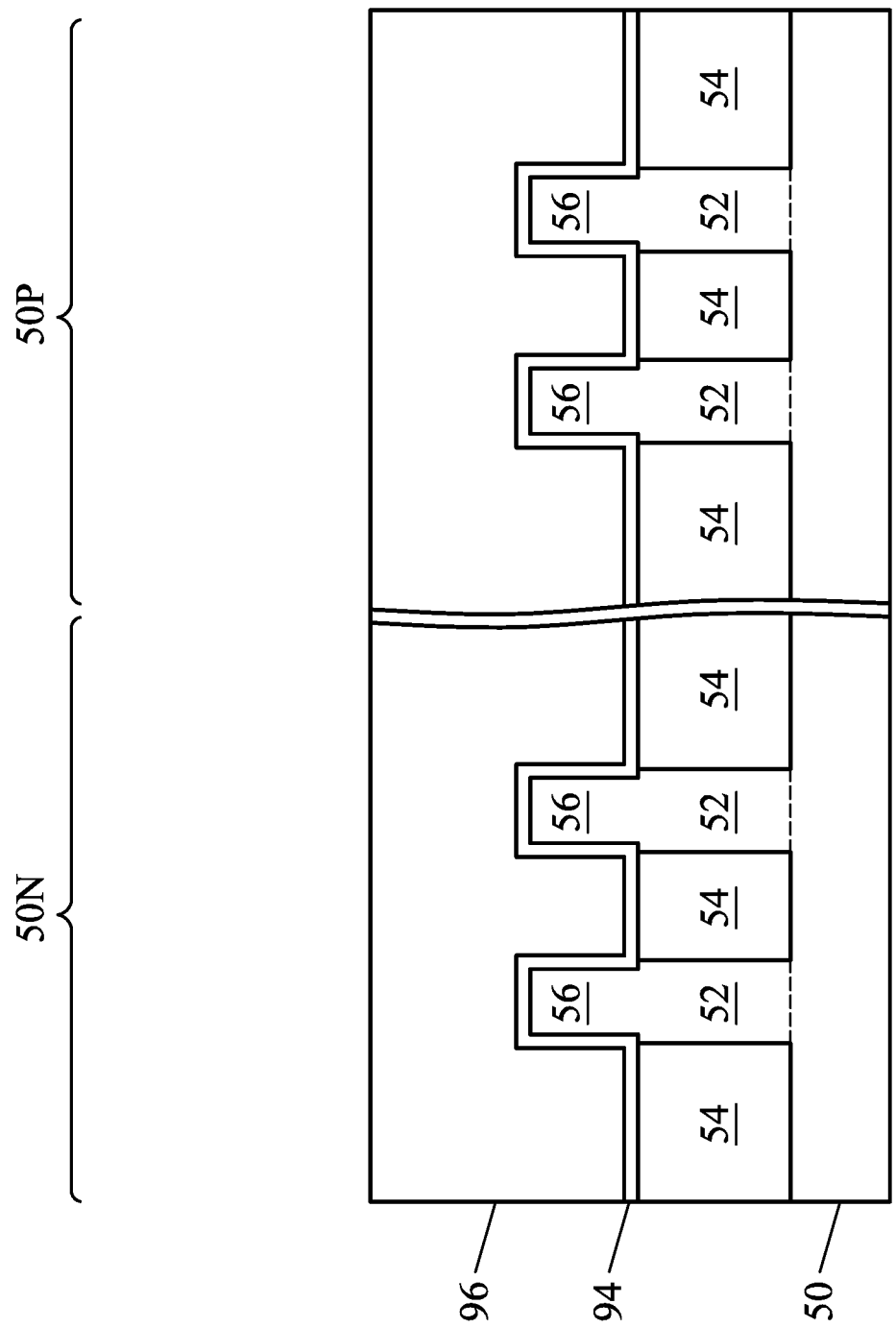
Figure 14B:
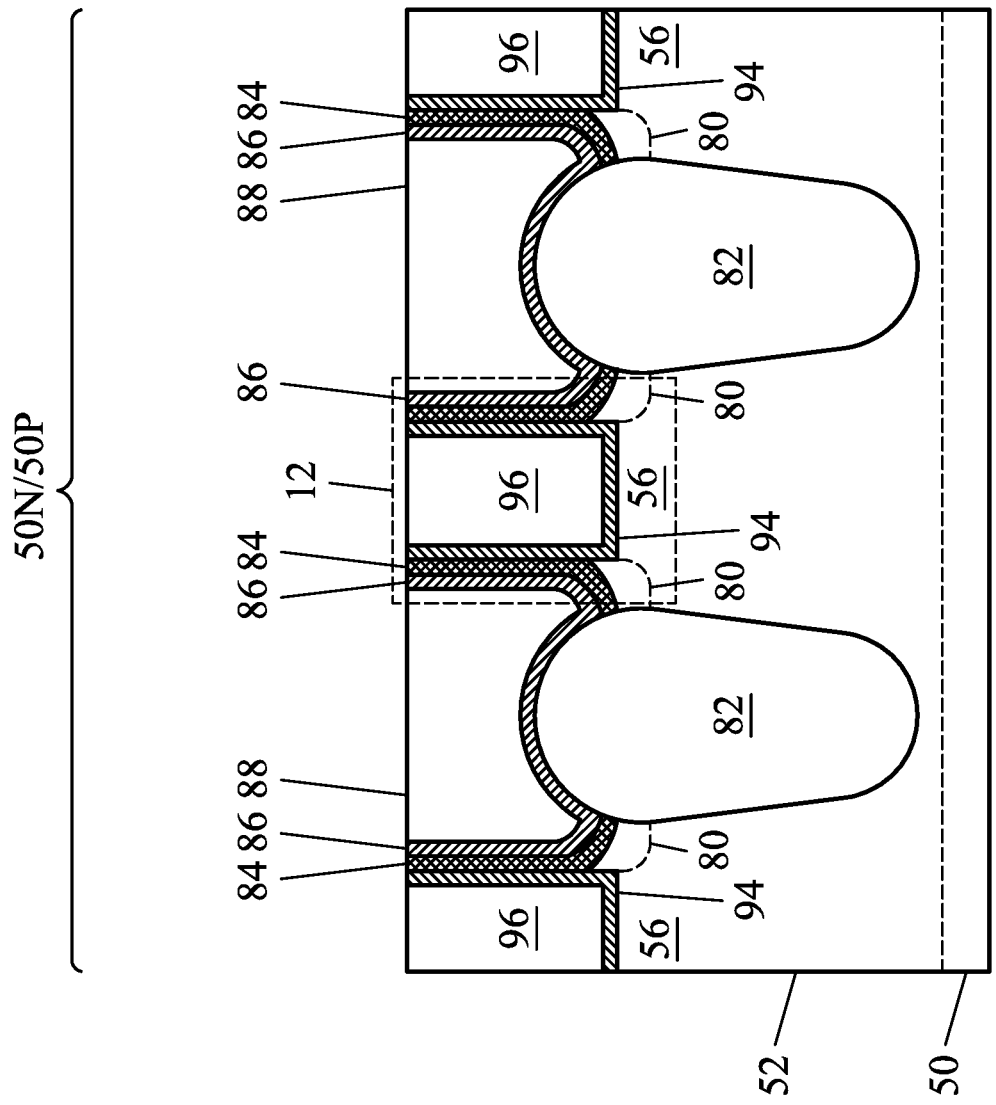
Figure 14C:
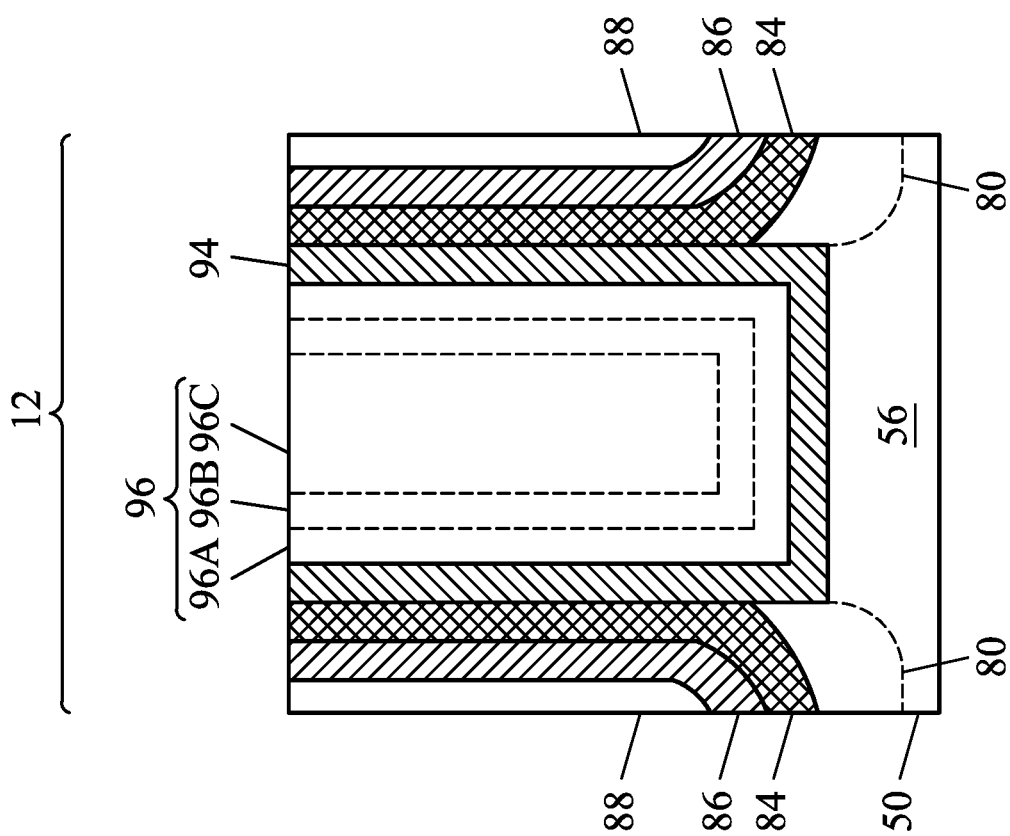

In FIGS. 14A and 14B, gate dielectrics 94 and gate electrodes 96 are formed for replacement gates. FIG. 14C illustrates a detailed view of region 12 of FIG. 14B. The gate dielectrics 94 are deposited conformally in the recesses 90, such as on the top surfaces and the sidewalls of the fins 52 and on sidewalls of the gate spacers 84. The gate dielectrics 94 may also be formed on top surface of the first ILD 88. In accordance with some embodiments, the gate dielectrics 94 comprise silicon oxide, silicon nitride, or multilayers thereof. In some embodiments, the gate dielectrics 94 include a high-k dielectric material, and in these embodiments, the gate dielectrics 94 may have a k value greater than about 7.0, and may include a metal oxide or a silicate of Hf, Al, Zr, La, Mg, Ba, Ti, Pb, and combinations thereof. The formation methods of the gate dielectrics 94 may include Molecular-Beam Deposition (MBD), Atomic Layer Deposition (ALD), PECVD, and the like. In embodiments where portions of the dummy gate dielectrics 70 remain in the recesses 90, the gate dielectrics 94 include a material of the dummy gate dielectric 70 (e.g., $SiO_2$).

The gate electrodes 96 are deposited over the gate dielectrics 94, respectively, and fill the remaining portions of the recesses 90. The gate electrodes 96 may include a metal-containing material such as TiN, TiO, TaN, TaC, Co, Ru, Al, W, combinations thereof, or multi-layers thereof. For example, although a single layer gate electrode 96 is illustrated in FIG. 14B, the gate electrode 96 may comprise any number of liner layers 96A, any number of work function tuning layers 96B, and a fill material 96C as illustrated by FIG. 14C. After the filling of the gate electrodes 96, a planarization process, such as a CMP, may be performed to remove the excess portions of the gate dielectrics 94 and the material of the gate electrodes 96, which excess portions are over the top surface of the ILD 88. The remaining portions of material of the gate electrodes 96 and the gate dielectrics 94 thus form replacement gates of the resulting FinFETs. Each gate electrode 96 and corresponding gate dielectric 94 may be collectively referred to as a "gate stack" or "metal gate stack." The gate stacks extend along sidewalls of the channel regions 56 of the fins 52.

The formation of the gate dielectrics 94 in the region 50N and the region 50P may occur simultaneously such that the gate dielectrics 94 in each region are formed from the same materials, and the formation of the gate electrodes 96 may occur simultaneously such that the gate electrodes 96 in each region are formed from the same materials. In some embodiments, the gate dielectrics 94 in each region may be formed by distinct processes, such that the gate dielectrics 94 may be different materials, and/or the gate electrodes 96 in each region may be formed by distinct processes, such that the gate electrodes 96 may be different materials. Various masking steps may be used to mask and expose appropriate regions when using distinct processes.

Figure 15A:
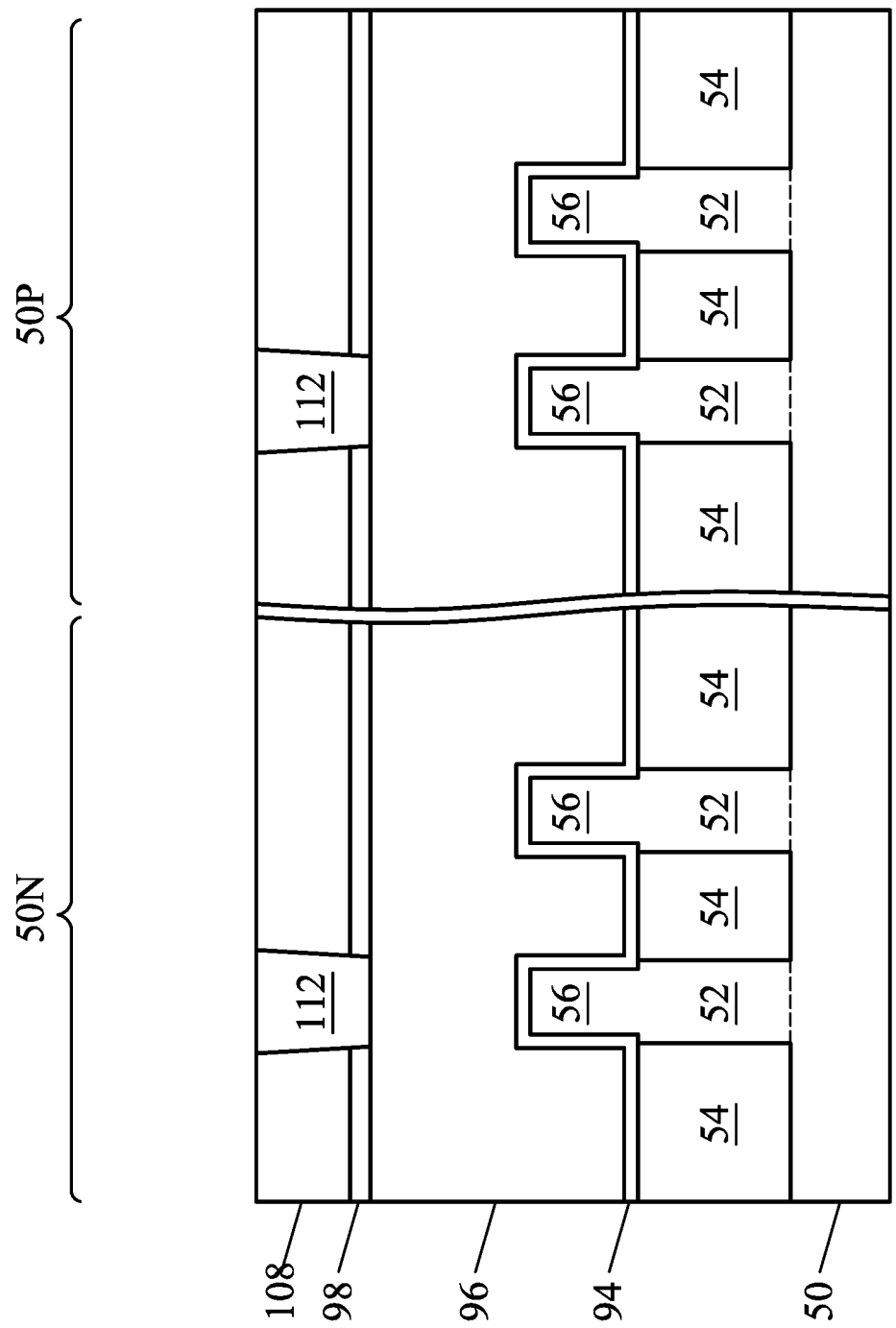
Figure 15B:
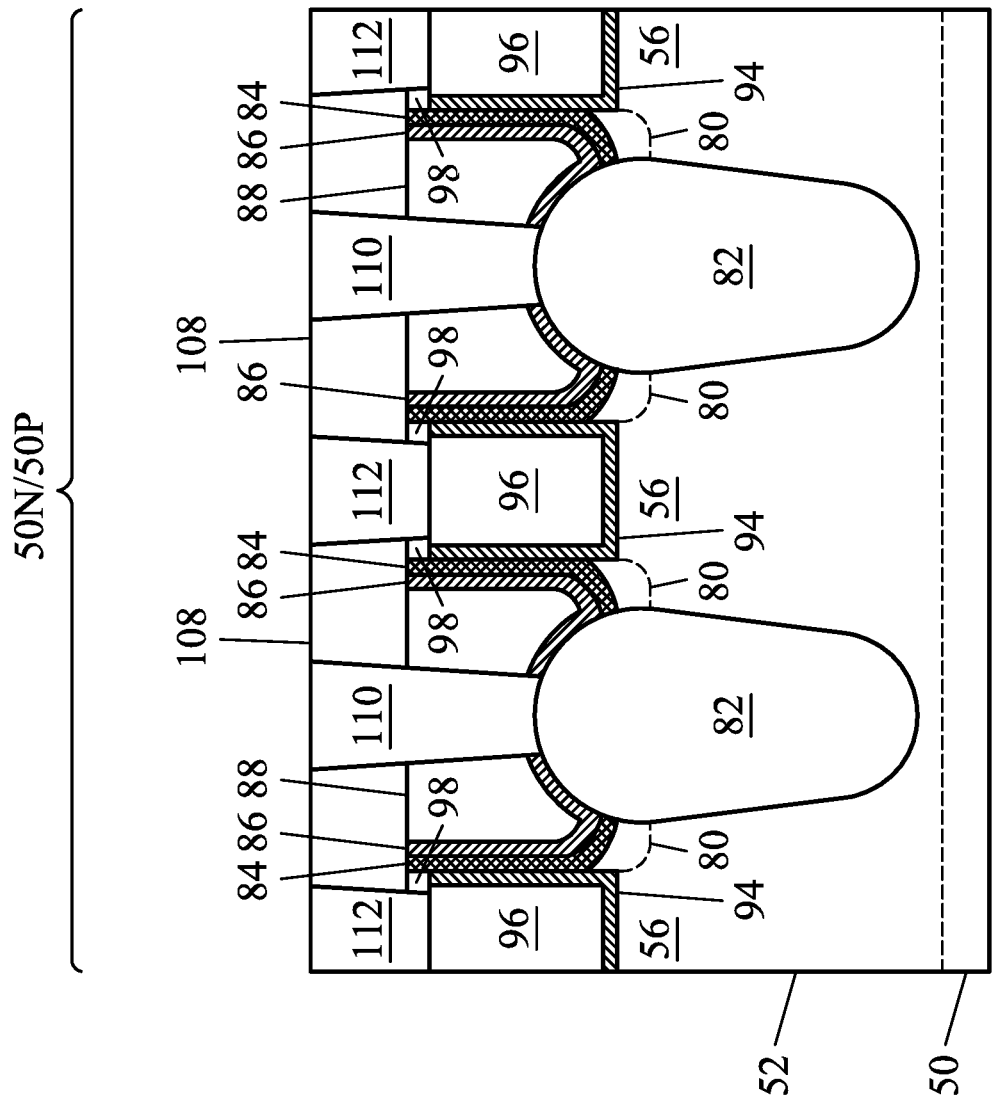

In FIGS. 15A and 15B, a second ILD 108 is deposited over the first ILD 88, and gate contacts 112 and source/drain contacts 110 are formed through the second ILD 108 and the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric 94 and a corresponding overlying gate electrode 96) is recessed, so that a recess is formed directly over the gate stack and between opposing portions of gate spacers 84. A gate mask 98 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 112 penetrate through the gate mask 98 to contact the top surface of the recessed gate electrode 96.

The gate contacts 112 and source/drain contacts 110 are formed through the second ILD 108 and the first ILD 88 in accordance with some embodiments. Openings for the source/drain contacts 110 are formed through the first ILD 88 and second ILD 108, and openings for the gate contacts 112 are formed through the second ILD 108 and the gate mask 98. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 110 and gate contacts 112 in the openings. An anneal process may be performed to form a silicide at the interface between the epitaxial source/drain regions 82 and the source/drain contacts 110. The source/drain contacts 110 are physically and electrically coupled to the epitaxial source/drain regions 82, and the gate contacts 112 are physically and electrically coupled to the gate electrodes 96. The source/drain contacts 110 and gate contacts 112 may be formed in different processes, or may be formed in the same process. Although shown as being formed in the same cross-sections, it should be appreciated that each of the source/drain contacts 110 and gate contacts 112 may be formed in different cross-sections, which may avoid shorting of the contacts.

Embodiments may achieve advantages. Delaying the fin trim process 92 until after the epitaxial source/drain regions 82 are formed allows a greater surface area of the fins 52 to be available during epitaxy. The epitaxial source/drain regions 82 may thus be formed to a greater volume with less defects, thereby increasing performance of the resulting FinFETs. Trimming the fins may help reduce SCE in the resulting FinFETs, and doing so when replacing the dummy gates 72 allows for a reduction of vertical separation between the channel regions 58 and the epitaxial source/drain regions 82. Reducing the vertical separation may help reduce current crowding effects, thereby further increasing performance of the resulting FinFETs, particularly in direct current and ring oscillator applications.

In an embodiment, a method includes: forming a fin extending from a substrate, the fin having a first width and a first height after the forming; forming a dummy gate stack over a channel region of the fin; growing an epitaxial source/drain in the fin adjacent the channel region; and after growing the epitaxial source/drain, replacing the dummy gate stack with a metal gate stack, the channel region of the fin having the first width and the first height before the replacing, the channel region of the fin having a second width and a second height after the replacing, the second width being less than the first width, the second height being less than the first height. In some embodiments of the method, the replacing the dummy gate stack with the metal gate stack includes: removing the dummy gate stack to expose the channel region of the fin; trimming the exposed channel region of the fin; and forming the metal gate stack on the trimmed channel region of the fin. In some embodiments of the method, the trimming the channel region of the fin includes: oxidizing surfaces of the exposed channel region of the fin; and removing the oxidized surfaces of the channel region of the fin, where the oxidizing and the removing are cyclically repeated a predetermined quantity of times. In some embodiments of the method, the trimming the channel region of the fin includes: etching the exposed channel region of the fin for a predetermined amount of time. In some embodiments, the method further includes: forming a lightly doped source/drain (LDD) region in the fin adjacent the channel region, the epitaxial source/drain being grown at least partially in the LDD region of the fin, where a topmost surface of the LDD region extends above a topmost surface of the channel region after the replacing the dummy gate stack. In some embodiments of the method, the LDD region extends between the epitaxial source/drain and the channel region, the LDD region having a length of 6 nm or less. In some embodiments of the method, a first difference between the first height and the second height is from 0.2 nm to 2 nm. In some embodiments of the method, a second difference between the first width and the second width is from 0.2 nm to 5 nm.

In an embodiment, a method includes: forming shallow trench isolation (STI) regions around a fin, the fin extending from between neighboring STI regions, the fin having a first width and a first height after the forming; forming a dummy gate stack on the STI regions and the fin; growing a source/drain region in the fin adjacent the dummy gate stack, a portion of the fin retaining the first width and the first height after the growing; removing the dummy gate stack to form a recess exposing the portion of the fin; after removing the dummy gate stack, trimming the portion of the fin exposed by the recess, the trimmed portion of the fin having a second width and a second height after the trimming, the second width being less than the first width, the second height being less than the first height; and forming a metal gate stack on the trimmed portion of the fin.

In some embodiments of the method, the trimming the portion of the fin includes: oxidizing surfaces of the portion of the fin exposed by the recess; and removing the oxidized surfaces of the fin, where the oxidizing and the removing are cyclically repeated a predetermined quantity of times. In some embodiments of the method, the oxidizing the surfaces of the portion of the fin includes: performing a thermal oxidation process on the fin, the thermal oxidation process being performed at a temperature of from 300° C. to 1050° C., and for a time span of from 10 seconds to 600 seconds. In some embodiments of the method, oxidizing the surfaces of the portion of the fin includes: exposing the fins to a chemical oxidizer. In some embodiments of the method, the removing the oxidized surfaces of the fin includes: etching the oxidized surfaces of the fin with dilute hydrofluoric (dHF) acid. In some embodiments of the method, the trimming the portion of the fin includes: etching surfaces of the portion of the fin exposed by the recess for a predetermined amount of time. In some embodiments of the method, the etching the surfaces of the portion of the fin includes: performing a wet etch on the fin with etchants including diluted hydrofluoric (dHF) acid, a buffered oxide etchant (BOE), standard clean-1 (SC1), standard clean-2 (SC2), or a sulfuric acid-hydrogen peroxide mixture (SPM) for a time span of from 3 seconds to 100 seconds. In some embodiments of the method, the etching the surfaces of the portion of the fin includes: performing a dry etch on the fin with etchants including a fluorocarbon ($C_xF_y$) gas, a chlorofluorocarbon ($C_xCl_yF_z$) gas, a carbon chloride ($C_xCl_y$) gas, hydrogen fluoride (HF) gas, hydrogen chloride (HCl) gas, or hydrogen bromide (HBr) gas for a time span of from 3 seconds to 100 seconds. In some embodiments of the method, a first difference between the first height and the second height is from 0.5% to 15% of the first height. In some embodiments of the method, a second difference between the first width and the second width is from 0.5% to 50% of the first width.

In an embodiment, a device includes: a fin extending from a substrate; a metal gate stack over a channel region of the fin; a lightly doped source/drain (LDD) region in the fin adjacent the channel region, the LDD region having a concave topmost surface, the concave topmost surface being disposed above the channel region; an epitaxial source/drain in the fin adjacent the LDD region, the concave topmost surface of the LDD region extending from a sidewall of the epitaxial source/drain to a sidewall of the metal gate stack; and a gate spacer having a first portion extending along a sidewall of the metal gate stack and a second portion extending along the concave topmost surface of the LDD region.

In some embodiments of the device, a width of the LDD region is greater than a width of the channel region in a top-down view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate on a channel region of a semiconductor fin, the semiconductor fin protruding above an isolation region;
    growing a source/drain region in the semiconductor fin adjacent the dummy gate;
    depositing an etch stop layer on the source/drain region;
    forming an inter-layer dielectric on the etch stop layer;
    removing the dummy gate to expose the channel region of the semiconductor fin;
    after removing the dummy gate, trimming the channel region by performing a plurality of oxidation and etch cycles, each of the oxidation and etch cycles removing a same amount of the channel region;
    after trimming the channel region, forming a metal gate on the channel region, the metal gate extending along a sidewall of the channel region and along a top surface of the isolation region; and
    forming a source/drain contact through the inter-layer dielectric and the etch stop layer, the source/drain contact coupled to the source/drain region, wherein the inter-layer dielectric and the etch stop layer are each between the source/drain contact and the metal gate.

2. The method of claim 1 further comprising:
    forming a gate contact coupled to the metal gate, a height of the source/drain contact being greater than a height of the gate contact.

3. The method of claim 1, wherein trimming the channel region reduces a width of the channel region by 0.5% to 50%.

4. The method of claim 1, wherein trimming the channel region reduces a height of the channel region by 0.5% to 15%.

5. The method of claim 1, wherein each oxidation cycle comprises a thermal oxidation process performed at a temperature of from 300° C. to 1050° C. and for a time span of from 10 seconds to 600 seconds.

6. The method of claim 1, wherein each etch cycle comprises a chemical oxide removal performed with dilute hydrofluoric acid.

7. A method comprising:
    forming a semiconductor fin protruding above an isolation region;
    forming a dummy gate on a channel region of the semiconductor fin, the channel region having a height above the isolation region, the channel region having a width;
    removing the dummy gate from the channel region;
    after removing the dummy gate, trimming the channel region to reduce the height and the width of the channel region; and
    after trimming the channel region, forming a metal gate on the channel region.

8. The method of claim 7, wherein the trimming the channel region comprises:
    oxidizing surfaces of the channel region; and
    removing the oxidized surfaces of the channel region, wherein the oxidizing and the removing are cyclically repeated a predetermined quantity of times.

9. The method of claim 8, wherein the oxidizing the surfaces of the channel region comprises:
    performing a thermal oxidation process on the channel region, the thermal oxidation process being performed at a temperature of from 300° C. to 1050° C., and for a time span of from 10 seconds to 600 seconds.

10. The method of claim 8, wherein oxidizing the surfaces of the channel region comprises:
    exposing the channel region to a chemical oxidizer.

11. The method of claim 8, wherein the removing the channel region comprises:
    etching the oxidized surfaces of the channel region with dilute hydrofluoric acid.

12. The method of claim 7, wherein the trimming the channel region comprises:
    etching surfaces of the channel region for a predetermined amount of time.

13. The method of claim 12, wherein the etching the surfaces of the channel region comprises:
    performing a wet etch on the channel region with etchants comprising diluted hydrofluoric acid, a buffered oxide etchant, standard clean-1, standard clean-2, or a sulfuric acid-hydrogen peroxide mixture for a time span of from 3 seconds to 100 seconds.

14. The method of claim 12, wherein the etching the surfaces of the channel region comprises:
    performing a dry etch on the channel region with etchants comprising a fluorocarbon gas, a chlorofluorocarbon gas, a carbon chloride gas, hydrogen fluoride gas, hydrogen chloride gas, or hydrogen bromide gas for a time span of from 3 seconds to 100 seconds.

15. The method of claim 7 further comprising:
    before removing the dummy gate, growing a source/drain region in the semiconductor fin adjacent the dummy gate;
    forming an inter-layer dielectric on the source/drain region; and
    forming a source/drain contact through the inter-layer dielectric, the source/drain contact coupled to the source/drain region.

16. A method comprising:
    removing a dummy gate from a semiconductor fin to expose a channel region of the semiconductor fin, the channel region adjacent a lightly doped source/drain region of the semiconductor fin;
    after removing the dummy gate, oxidizing a portion of the channel region;
    removing the oxidized portion of the channel region, a first width of the lightly doped source/drain region being greater than a second width of the channel region, a first height of the lightly doped source/drain region being greater than a second height of the channel region; and
    forming a metal gate on the channel region.

17. The method of claim 16, wherein a transition from the first width of the lightly doped source/drain region to the second width of the channel region has a step interface shape.

18. The method of claim 16, wherein a transition from the first width of the lightly doped source/drain region to the second width of the channel region has a linear interface shape.

19. The method of claim 16, wherein a transition from the first width of the lightly doped source/drain region to the second width of the channel region has a curved interface shape.

20. The method of claim 16, further comprising:
before removing the dummy gate, growing a source/drain region in the semiconductor fin, the source/drain region adjacent the lightly doped source/drain region.

* * * * *